US010797658B1

(12) United States Patent
Raj

(10) Patent No.: US 10,797,658 B1
(45) Date of Patent: Oct. 6, 2020

(54) LOW POWER OPTICAL LINK

(71) Applicant: Xilinx, Inc., San Jose, CA (US)

(72) Inventor: Mayank Raj, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/525,258

(22) Filed: Jul. 29, 2019

(51) Int. Cl.
*H04B 10/00* (2013.01)
*H03F 3/08* (2006.01)
*H01L 23/522* (2006.01)
*H01L 23/64* (2006.01)
*H03F 1/34* (2006.01)
*H04B 10/25* (2013.01)
*H04L 25/03* (2006.01)
*H04B 10/61* (2013.01)

(52) U.S. Cl.
CPC ........ *H03F 3/082* (2013.01); *H01L 23/5226* (2013.01); *H01L 23/5227* (2013.01); *H01L 23/645* (2013.01); *H03F 1/342* (2013.01); *H04B 10/25* (2013.01); *H04B 10/61* (2013.01); *H04L 25/03821* (2013.01); *H03F 2200/117* (2013.01); *H03F 2200/129* (2013.01); *H03F 2200/165* (2013.01); *H03F 2200/216* (2013.01)

(58) Field of Classification Search
USPC ................................................ 398/202–214
See application file for complete search history.

(56) References Cited

U.S. PATENT DOCUMENTS

| 8,452,582 | B1 | 5/2013 | Al-Hawari et al. |
| 9,960,844 | B1 | 5/2018 | Raj et al. |
| 2002/0086649 | A1 | 7/2002 | Vathulya |
| 2006/0067713 | A1* | 3/2006 | Farooqui .................. H03F 1/08 398/209 |
| 2007/0058976 | A1 | 3/2007 | Tatum et al. |
| 2013/0188965 | A1 | 7/2013 | Afrait et al. |
| 2014/0126622 | A1* | 5/2014 | McLeod ................. H03F 1/086 375/229 |
| 2015/0229281 | A1* | 8/2015 | Jiang ....................... H03F 1/523 398/202 |

(Continued)

OTHER PUBLICATIONS

M. Rakowski et al., "A 4x20Gb/s WDM Ring-Based Hybrid CMOS Silicon Photonics Transceiver," 2015 IEEE International Solid-State Circuits Conference (ISSCC), Digest of Technical Papers, San Francisco, California, 2015, pp. 1-3.

(Continued)

*Primary Examiner* — Agustin Bello
(74) *Attorney, Agent, or Firm* — Paradice and Li LLP

(57) ABSTRACT

An optical receiver circuit is disclosed, including a photodiode, an output terminal, a first amplifier stage, and an electrostatic discharge (ESD) protection circuit. The photodiode may generate a receiver current based on received optical signals. The first amplifier stage may be coupled between the photodiode and the output terminal and include a first inductor coupled between the photodiode and an input of a first inverter, and a second inductor coupled between the input of the first inverter and a first resistor. The first resistor may be coupled between the second inductor and an output of the first inverter. ESD protection circuit may be coupled to the input of the first inverter. The output terminal may generate an output signal based at least in part on the output of the first inverter.

19 Claims, 10 Drawing Sheets

(56) References Cited

U.S. PATENT DOCUMENTS

2016/0372888 A1  12/2016  Tan et al.
2017/0031384 A1* 2/2017  Bucelot .................... G06F 1/10

OTHER PUBLICATIONS

J. Proesel et al., "A 32Gb/s, 4.7pJ/bit Optical Link with -11.7dBm Sensitivity in 14nm FinFET CMOS," 2017 Symposium on VLSI Circuits, Kyoto, 2017, pp. C318-C319.
Palermo, Samuel et al., "High-Speed Transmitters in 90nm CMOS for High-Density Optical Interconnects," Proc. of the 32nd European Solid-State Ciruits Conference, Sep. 19, 2006, pp. 508-511, IEEE, Piscataway, New Jersey, USA.
Ohhata et al; Design of a 4X 10 Gb/s VCSEL Driver using Asymmetric Emphasis Technique in 90-nm CMOS for Optical Interconnection; May 2010; IEEE; pp. 1 107-1 1 15. (Year: 2010).
Kozlov et al; Capacitively-Coupled CMOS VCSEL Driver circuits; Sep. 2016; IEEE; pp. 2077-2090. (Year: 2016).
Kern et al; 18Gb/s Optical 10: VCSEL Driver and TIA in 90nm CMOS; 2007, Symposium on VLSI Circuits Digest of Technical Papers; pp. 276-277 (Year 2007).

* cited by examiner

LOW POWER OPTICAL LINK

TECHNICAL FIELD

Aspects of the present disclosure relate generally to electro-optical communications, and specifically to optical receiver circuits.

BACKGROUND

Fiber-optics allow information to be transmitted through an optical link (such as optical fiber) as pulses of light. The light forms an electromagnetic carrier wave that can be modulated to carry data, control signals, and other information. Optical links have significantly higher bandwidths and are less susceptible to electromagnetic interference than conventional electrical cabling (such as copper wires and Ethernet cables) and are often used to transmit data over relatively long distances. Optical transmitters may be used to convert electrical signals into optical signals suitable for transmission via optical links, and optical receivers may be used to convert optical signals into electrical signals suitable for transmission via electrical cabling.

The conversion of optical signals to electrical signals may be performed using a photodetector (such as a photodiode) that generates an electrical current in response to received light pulses, for example, such that a magnitude of the generated current is indicative of the intensity of the received light pulses. Currents generated by the photodetector may be converted to voltages using trans-impedance amplifier (TIA) circuits, which typically include an inverter having resistive feedback. However, achieving sufficient bandwidth and gain using TIA circuits may consume undesirably large amounts of power. Further, conventional high-speed optical receivers typically include error-correction circuitry (such as decision feedback equalization (DFE) circuitry) to ensure the accurate reception and decoding of modulated light signals. Such error-correction circuitry also consumes undesirably large amounts of power.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to optical receiver circuits and methods of their operation. In one aspect of the present disclosure, an optical receiver circuit is disclosed. Such an optical receiver circuit may include an input terminal to receive an input signal indicative of information contained in an optical signal, an output terminal to provide an output signal based at least in part on the input signal, and a first amplifier stage coupled between the input and output terminals of the optical receiver circuit. The first amplifier stage may include a first inverter including an output coupled to the output terminal of the optical receiver circuit, a first inductor coupled between the input terminal of the optical receiver circuit and an input of the first inverter, and a second inductor and a first resistor coupled between the input and the output of the first inverter.

In another aspect of the present disclosure, another optical receiver circuit is disclosed. The optical receiver circuit may include a photodiode configured to generate an input current based on received optical signals, an output terminal configured to generate an output signal based on the input current, and a first amplifier stage coupled between the input and output terminals of the optical receiver circuit. The first amplifier stage may include a first inverter including an output coupled to the output terminal of the optical receiver circuit, a first inductor coupled to an input of the first inverter and configured to isolate or hide parasitic capacitances associated with the input terminal of the optical receiver circuit, and second inductor coupled to the input of the first inverter and configured to increase an effective feedback impedance of the optical receiver circuit at one or more operating frequencies.

In another aspect of the present disclosure a method for operating an optical receiver circuit including at least a photodiode, an output terminal, and a first amplifier stage is disclosed. The method may include receiving one or more optical signals at the photodiode and generating an input signal based on the received optical signals, hiding an input capacitance of the optical receiver circuit using a first inductor of the first amplifier stage, the first inductor coupled between the photodiode and an input of a first inverter of the first amplifier stage, increasing an effective feedback impedance of the optical receiver circuit using a second inductor of the first amplifier stage, the second inductor coupled between the input of the first inverter and a first resistor, wherein the first resistor is coupled between the second inductor and an output of the first inverter, and generating an output signal at the output terminal, the output signal based at least in part on an output of the first inverter.

In another aspect of the present disclosure, an optical driver circuit is disclosed. The optical driver circuit may include an input terminal to receive an input signal, an output terminal to generate an output signal, a pull-up transistor, and a pull-down transistor. The pull-up transistor may be coupled between the output terminal and a first voltage supply, and may include a gate responsive to the input signal and a source terminal inductively coupled to the output terminal via a first inductor. The pull-down transistor may be coupled between the output terminal and a second voltage supply, and may include a gate responsive to the input signal and a source terminal inductively coupled to the output terminal via a second inductor, wherein the first and second inductors form an inductive circuit configured to isolate parasitic capacitances in the pull-up transistor from the output terminal and to isolate parasitic capacitances in the pull-down transistor from the output terminal. In some implementations, the optical driver circuit may include a first transistor coupled between the pull-up transistor and the first voltage supply, and may include a second transistor coupled between the pull-down transistor and the second voltage supply. The first transistor may include a gate to receive a first control signal, and the second transistor may include a gate to receive a second control signal. The first and second control signals may be based on an asymmetric response of an associated electro-optical converter to rising and falling edge transitions of the output signal.

In some implementations, the first inductor is configured to isolate parasitic capacitances in the pull-up circuit from the output terminal during falling edge transitions of the output signal, and the second inductor is configured to isolate parasitic capacitances in the pull-down circuit from the output terminal during rising edge transitions of the output signal. In addition, or in the alternative, an impedance of the first inductor may be increased based at least in part on higher-frequency components of the output signal during falling edge transitions of the output signal, and an impedance of the second inductor may be increased based at least in part on higher-frequency components of the output signal during rising edge transitions of the output signal.

In another aspect of the present disclosure, a method for operating an optical driver circuit including at least an input terminal, an output terminal, a pull-up circuit, and a pull-down circuit is disclosed. The method may include receiving an input signal at the input terminal; generating an output signal based at least in part on the input signal; adjusting rising edge transitions of the output signal based on a first control signal; adjusting falling edge transitions of the output signal based on a second control signal; isolating parasitic capacitances in the pull-down circuit from the output terminal during the rising edge transitions of the output signal using a first inductor; and isolating parasitic capacitances in the pull-up circuit from the output terminal during falling edge transitions of the output signal using a second inductor. The rising edge transitions and the falling edge transitions are adjusted independently of each other, and the first and second control signals may be configured to introduce asymmetry between the rising and falling edge transitions of the output signal.

The method may also include determining an asymmetric response of an electro-optical converter to the rising and falling edge transitions of the output signal; and selecting values for the first and second control signals based on the determined asymmetric response. In some implementations, a speed of the rising edge transitions of the output signal may be based at least in part on the selected value of the first control signal, and a speed of the falling edge transitions of the output signal may be based at least in part on the selected value of the second control signal. In addition, or in the alternative, an impedance of the first inductor may be increased during falling edge transitions of the output signal based at least in part on higher-frequency components of the output signal, and an impedance of the second inductor may be increased during rising edge transitions of the output signal based at least in part on higher-frequency components of the output signal.

BRIEF DESCRIPTION OF THE DRAWINGS

The example implementations disclosed herein are illustrated by way of example and are not intended to be limited by the figures of the accompanying drawings. Like numbers reference like elements throughout the drawings and specification.

DETAILED DESCRIPTION

Figure 1:
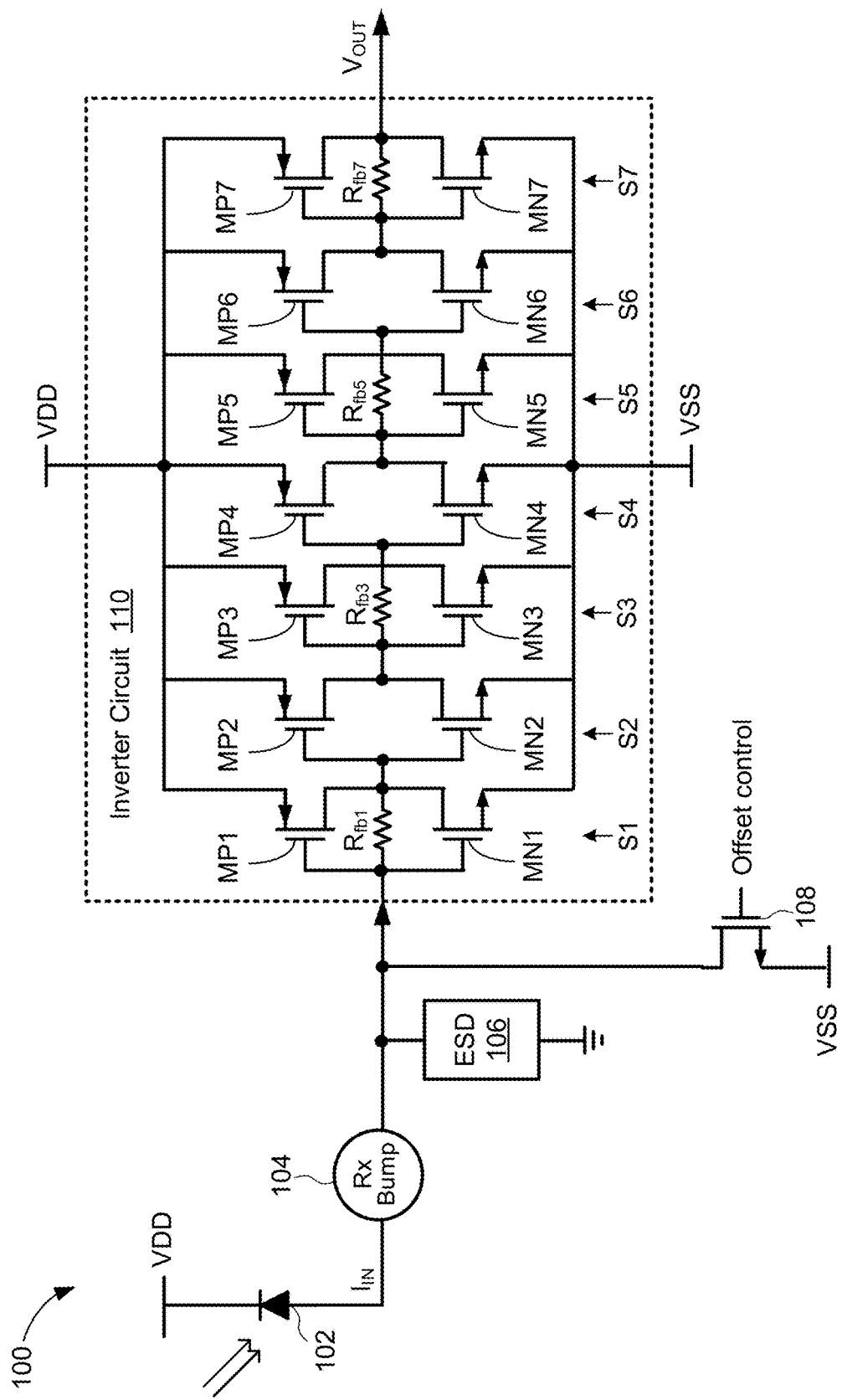
FIG. 1 is a block diagram of an optical receiver circuit.

Aspects of the present disclosure may allow an optical receiver circuit to achieve higher gains and greater bandwidth while consuming less power than conventional optical receiver circuits. More specifically, aspects of the present disclosure may increase the signal-to-noise ratio (SNR) associated with the optical receiver circuits disclosed herein by increasing the high-frequency content of input signals using over-peaking techniques. In this manner, the bandwidth of optical receiver circuits disclosed herein may be increased without a corresponding increase in signal noise, which in turn may allow the optical receiver circuits disclosed herein to maintain relatively low error rates without using power-intensive error correction techniques such as, for example, decision feedback equalization circuitry.

The SNR associated with the optical receiver circuit may be increased (at least in part) by isolating parasitic capacitances from the input terminal of the optical driver circuit. An example optical receiver circuit may include one or more amplifier stages each having an inductive circuit configured to isolate or hide parasitic capacitances associated with electrostatic discharge protection circuits, bias voltages and/or currents, and transistor gates. In some implementations, the inductive circuit may include a first inductor configured to hide input loading, and may include a second inductor configured to increase effective feedback impedances at relatively high frequencies (such as frequencies greater than a threshold value). In some aspects, the first and second inductors of the inductive circuit may be coupled in series with each other, the first inductor may be a first inductive coil formed in a first metal layer of a semiconductor device, and the second inductor may be a second inductive coil formed in a second metal layer of the semiconductor device. The first and second inductive coils may be of the same size and shape, and may be aligned relative to each other (such as by positioning the first inductive coil over the second inductive coil) to provide symmetry and balanced operations for the inductive circuit.

In addition, or in the alternative, the inductive circuit may provide an inductive coupling having a high self-resonant frequency between the first inductor and second inductor. The high self-resonant frequency may minimize capacitive loading on the optical receiver circuit's input terminal resulting from the first and second inductive coils, which in turn may further increase the bandwidth of the optical receiver circuit.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example implementations. However, it will be apparent to one skilled in the art that these specific details may not be required to practice the example implementations. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example implementations are not to be construed as limited to specific examples described herein but rather to include within their scope all implementations defined by the appended claims.

FIG. 1 is a block diagram of an optical receiver circuit 100. The optical receiver circuit 100 is depicted as including or coupled to a photodiode 102, an RX bump (or RX bond pad) 104, an electrostatic discharge (ESD) protection circuit 106, an offset control transistor 108, and a multi-stage inverter circuit 110 having resistive feedback. The photodiode 102 may receive optical signals (such as light pulses) and convert the received optical signals into an input current ($I_{IN}$). The input current, which may be indicative of intensity levels, pulse widths, and other characteristics of the received optical signal, may be provided to an input terminal of the optical receiver circuit 100 via the RX bump 104. The ESD protection circuit 106, which is coupled between the RX bump 104 and ground potential, may be used to prevent damage to the optical receiver circuit 100 resulting from ESD events.

The offset control transistor 108 and the multi-stage inverter circuit 110 may form a transimpedance amplifier (TIA) circuit. For the example of FIG. 1, the multi-stage inverter circuit 110 is shown to include seven inverter stages S1-S7, with each of the inverter stages S1-S7 including a CMOS inverter formed by a PMOS transistor and an NMOS transistor coupled in series between a first supply voltage VDD and a second supply voltage VSS. Each PMOS transistor may include a first terminal coupled to VDD, a gate terminal coupled to an output terminal of a previous inverter stage (or to the RX bump 104 for the first stage S1), and a second terminal coupled to the output terminal of the inverter stage. Each NMOS transistor may include a first terminal coupled to VSS, a gate terminal coupled to the output terminal of the previous inverter stage (or to the RX bump 104 for the first inverter stage S1), and a second terminal coupled to the output terminal of the inverter stage. For example, the first inverter stage S1 includes a CMOS inverter formed by PMOS transistor MP1 and an NMOS transistor MN1, with the gate terminals of transistors MP1-MN1 coupled to the RX bump 104, and the commonly-coupled terminals of transistors MP1-MN1 forming the output terminal of the first inverter stage S1. For another example, the second inverter stage S2 includes a CMOS inverter formed by PMOS transistor MP2 and an NMOS transistor MN2, with the gate terminals of transistors MP2-MN2 coupled to the output terminal of the first inverter stage S1, and the commonly-coupled terminals of transistors MP2-MN2 forming the output terminal of the second inverter stage S2.

In some implementations, a number of the inverter stages S1-S7 may also include a feedback resistor coupled between the input and output terminals of the corresponding inverter stage. For the example of FIG. 1, the first inverter stage S1 may include a feedback resistor $R_{fb1}$ coupled between the input and output terminals of the first inverter stage S1 (such that the feedback resistor $R_{fb1}$ is coupled between the commonly-coupled gates and second terminals of transistors MP1-MN1), the third inverter stage S3 may include a feedback resistor $R_{fb2}$ coupled between the input and output terminals of the third inverter stage S3 (such that the feedback resistor $R_{fb3}$ is coupled between the commonly-coupled gates and second terminals of transistors MP3-MN3), the fifth inverter stage S5 may include a feedback resistor $R_{fb5}$ coupled between the input and output terminals of the fifth inverter stage S5 (such that the feedback resistor $R_{fb5}$ is coupled between the commonly-coupled gates and second terminals of transistors MP5-MN5), and the seventh inverter stage S7 may include a feedback resistor $R_{fb7}$ coupled between the input and output terminals of the seventh inverter stage S7 (such that the feedback resistor $R_{fb7}$ is coupled between the commonly-coupled gates and second terminals of transistors MP7-MN7).

Although the multi-stage inverter circuit 110 may allow for acceptable bandwidth and gain at high operating frequencies, the multiple inverter stages S1-S7 may consume an undesirably large amount of power, which may limit the effective bandwidth and gain of the optical receiver circuit 100 (particularly in low-power applications). The optical receiver circuits disclosed herein may reduce power consumption (such as compared to the optical receiver circuit 100) by using one or more T-coil amplifier stages configured to hide or isolate parasitic capacitances, for example, rather than using power hungry multi-stage inverter circuits such as the inverter circuit 110 of FIG. 1. The ability to hide or isolate parasitic capacitances (and other loading) from inputs of optical receiver circuits disclosed herein may increase the SNR of input signals indicative of received optical information, thereby increasing the bandwidth of the optical receiver circuits without a corresponding increase in signal noise. In this manner, the optical receiver circuits disclosed herein may maintain relatively low data error rates without using power-intensive error correction circuitry such as, for example, decision feedback equalization circuitry. In some implementations, the SNR may be increased by increasing the high-frequency content of the input signals using over-peaking techniques.

Figure 2:
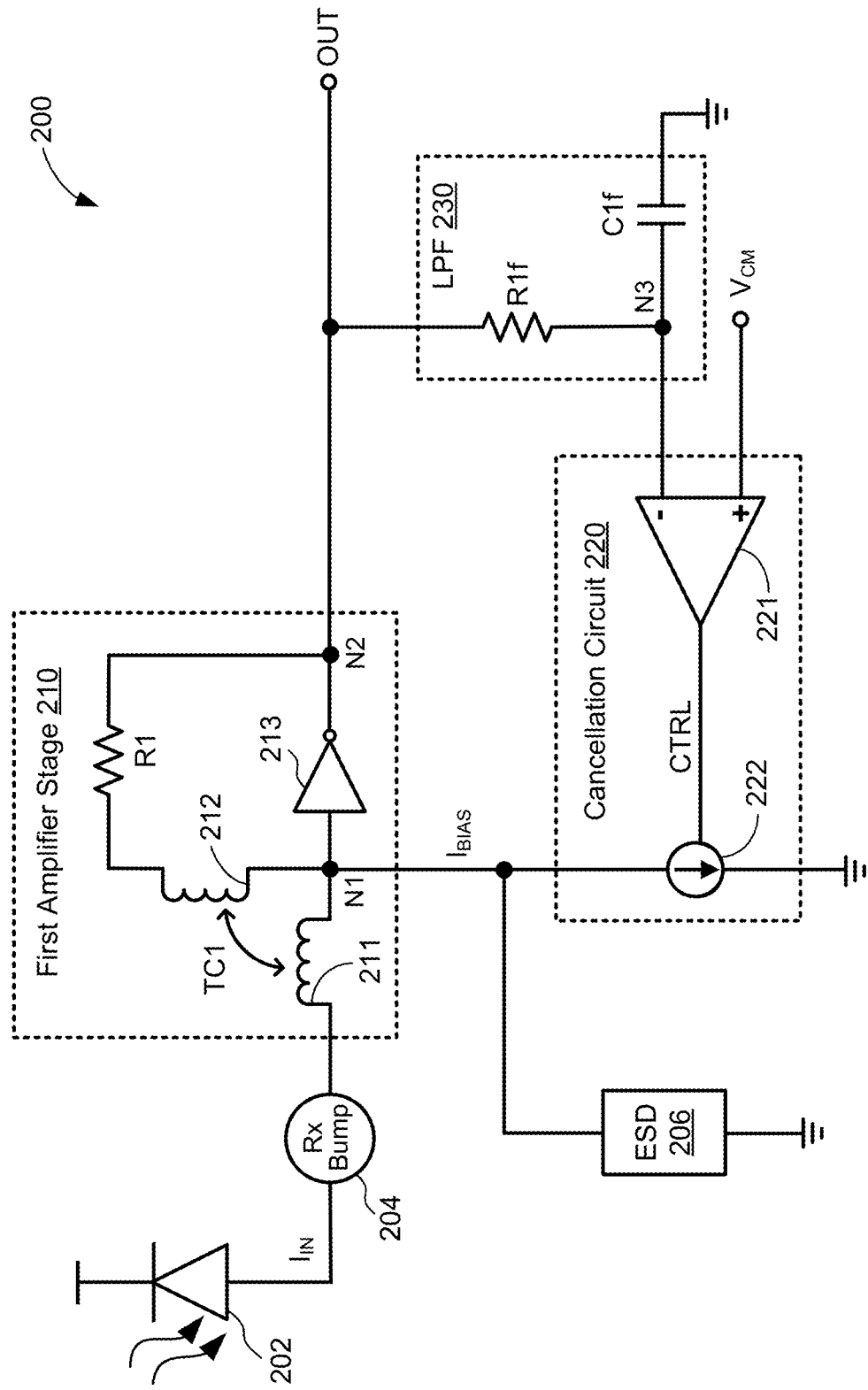
FIG. 2 is a block diagram of an example optical receiver circuit, in accordance with some implementations.

FIG. 2 shows an example optical receiver circuit 200, according to some implementations. The optical receiver circuit 200 is shown to include an RX bump 204, an ESD protection circuit 206, a first amplifier stage 210, a common mode current cancellation circuit 220, and a low-pass filter (LPF) 230. The RX bump 204, which may provide an input terminal for the optical receiver circuit 200, is coupled to a photodiode 202 that converts received optical signals into an electrical current ($I_{IN}$). Although depicted in the example of FIG. 2 as receiving an input current from photodiode 202, in other implementations, the optical receiver circuit 200 may receive an input current from any suitable photodetector circuit that can detect optical signals and generate a current indicative of one or more characteristics of the received optical signals. The ESD protection circuit 206, which is coupled between the RX bump 104 and ground potential, may be used to prevent damage to the optical receiver circuit 200 resulting from ESD events.

The first amplifier stage 210 may include a first inductor 211, a second inductor 212, an inverter 213, and a resistor R1. The first inductor 211 is coupled between the RX bump 204 and an input terminal of the first inverter 213 (at node N1), and the second inductor 212 is coupled between the input terminal of the inverter 213 and the resistor R1. The resistor R1 is coupled between the second inductor 212 and the output terminal of the inverter 213 (at node N2). The output terminal of the inverter 213 may provide an output signal (OUT) for the optical receiver circuit 200. In some implementations, the output signal OUT may be an output voltage ($V_{OUT}$).

The LPF 230 may include a resistor R1*f* and a capacitor C1*f*. The resistor R1*f* is coupled between the output terminal of the first stage amplifier 210 and the cancellation circuit 220 (at node N3), and the capacitor C1*f* is coupled between node N3 and ground potential. In some implementations, the LPF 230 may be configured to pass signals having frequencies of approximately 1 MHz or less, and to block signals having frequencies greater than approximately 1 MHz.

The current cancellation circuit 220 may include an operational amplifier (op-amp) 221 and a current source 222. The current source 222 is coupled between the input terminal of the inverter 213 (at node N1) and ground potential, and includes a control terminal to receive a control signal (CTRL). The op-amp 221 includes an inverting input terminal coupled to an output of the LPF 230, a non-inverting input terminal to receive a common-mode voltage $V_{CM}$, and an output terminal coupled to the control terminal of the current source 222. In some implementations, the op-amp 221 generates the control signal CTRL based on the common-mode voltage $V_{CM}$ and a low-pass filtered version of the output signal OUT. In some aspects, the control signal CTRL may be used to adjust the bias current (IBIAs) provided by the current source 222, for example, to cancel any DC currents present at the input terminal of the inverter 213 (at node N1).

The first amplifier stage 210 may be configured to isolate or hide parasitic capacitances associated with the ESD protection circuit 206, parasitic capacitances associated with the bias current, and parasitic capacitances associated with the gates of transistors (not shown for simplicity) that form the inverter 213. In some implementations, the first inductor 211 may be configured to hide input loading on the optical receiver circuit 200, and the second inductor 212 may be configured to increase an effective feedback impedance of the optical receiver circuit 200 at relatively high frequencies (such as frequencies greater than a threshold value). In some aspects, the threshold value may correspond to data rates of approximately 56 Gbps.

In some implementations, the first inductor 211 and the second inductor 212 may form or at least be part of an inductive circuit (TC1) that may increase the bandwidth of the optical receiver circuit 200 and/or that may reduce the power consumption of the optical receiver circuit 200, for example, as compared to the optical receiver circuit 100 of FIG. 1. In some aspects, the inductive circuit TC1 formed by the first inductor 211 and the second inductor 212 may be referred to as a T-coil inductor, and the first amplifier stage 210 may be referred to as a T-coil amplifier.

Figure 3:
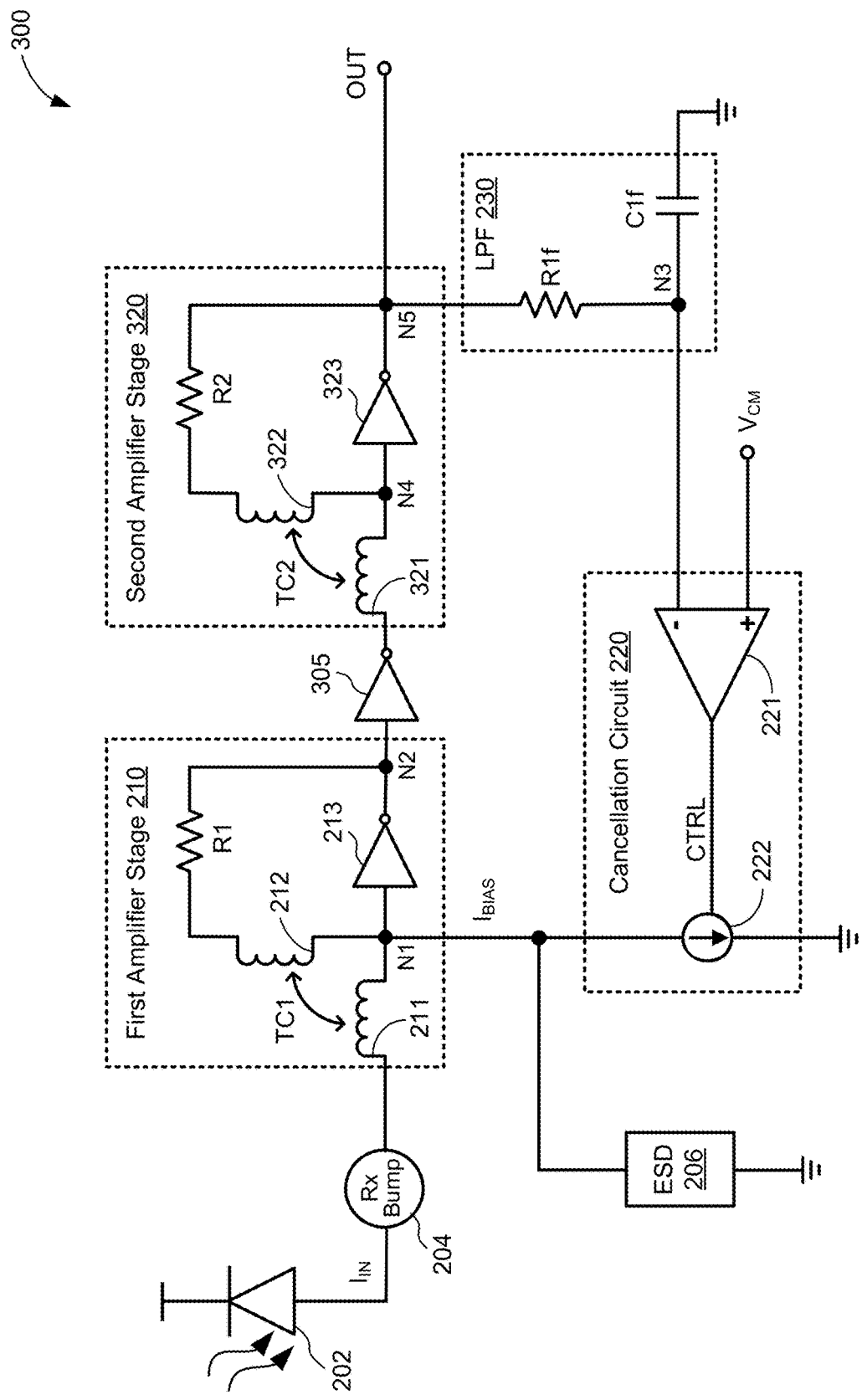
FIG. 3 is a block diagram of another example optical receiver circuit, in accordance with some implementations.

FIG. 3 shows another example optical receiver circuit 300, in accordance with some implementations. The optical receiver circuit 300 is similar in many aspects to the optical receiver circuit 200 of FIG. 2 (such as including the various components of the optical receiver circuit 200), and further includes an inverter 305 and a second amplifier stage 320 coupled between the first amplifier stage 210 and the output terminal of the optical receiver circuit 300. The inverter 305 includes an input terminal coupled to the output terminal of the first amplifier stage 210 (via inverter 213), and includes an output terminal coupled to an input terminal of the second amplifier stage 320. In some aspects, the inverter 305 may be used to amplify signals output from the first amplifier stage 210.

The second amplifier stage 320 may include a first inductor 321, a second inductor 322, an inverter 323, and a resistor R2. The first inductor 321 is coupled between the inverter 305 and an input terminal of the inverter 323 (at node N4), and the second inductor 322 is coupled between the input terminal of the inverter 323 and the first resistor R1. The resistor R1 is coupled between the second inductor 322 and the output terminal of the second inverter 323 (at node N5). The output terminal of the inverter 323 may provide an output signal (OUT) for the optical receiver circuit 300. In some implementations, the output signal OUT may be an output voltage ($V_{OUT}$).

For the example of FIG. 3, each of the first amplifier stage 210 and the second amplifier stage 320 may be configured to isolate or hide parasitic capacitances associated with the ESD protection circuit 206, parasitic capacitances associated with the bias current, and parasitic capacitances associated with transistor gates (such as transistors that form the inverters 213 and 323. In some implementations, the first inductor 211 of the first amplifier stage 210 may be configured to hide input loading on the optical receiver circuit 200, and the second inductor 212 of the first amplifier stage 210 may be configured to increase an effective feedback impedance of the optical receiver circuit 300 at relatively high operating frequencies (such as operating frequencies greater than a threshold value). Similarly, the first inductor 321 of the second amplifier stage 320 may be configured to hide input loading on the optical receiver circuit 300, and the second inductor 322 of the second amplifier stage 320 may be configured to increase the effective feedback impedance of the optical receiver circuit 300 at the relatively high operating frequencies. In some aspects, the threshold value may correspond to data rates of approximately 56 Gbps.

In some implementations, the inductors 211 and 212 of the first amplifier stage 210 may form or at least be part of a first inductive circuit TC1 that increases the bandwidth of the optical receiver circuit 300 and/or reduces the power consumption of the optical receiver circuit 300 (as compared to the optical receiver circuit 100 of FIG. 1), and the inductors 321 and 322 of the second amplifier stage 320 may form or at least be part of a second inductive circuit TC2 that increases the bandwidth of the optical receiver circuit 300 and/or reduces the power consumption of the optical receiver circuit 300 (as compared to the optical receiver circuit 100 of FIG. 1). The inductive circuits TC1 and TC2 may be referred to as T-coil inductors. In some aspects, the first and second amplifier stages 210 and 320 may allow the optical receiver circuit 300 to achieve approximately double the bandwidth of the optical receiver circuit 100 for a given power consumption.

Figure 4:
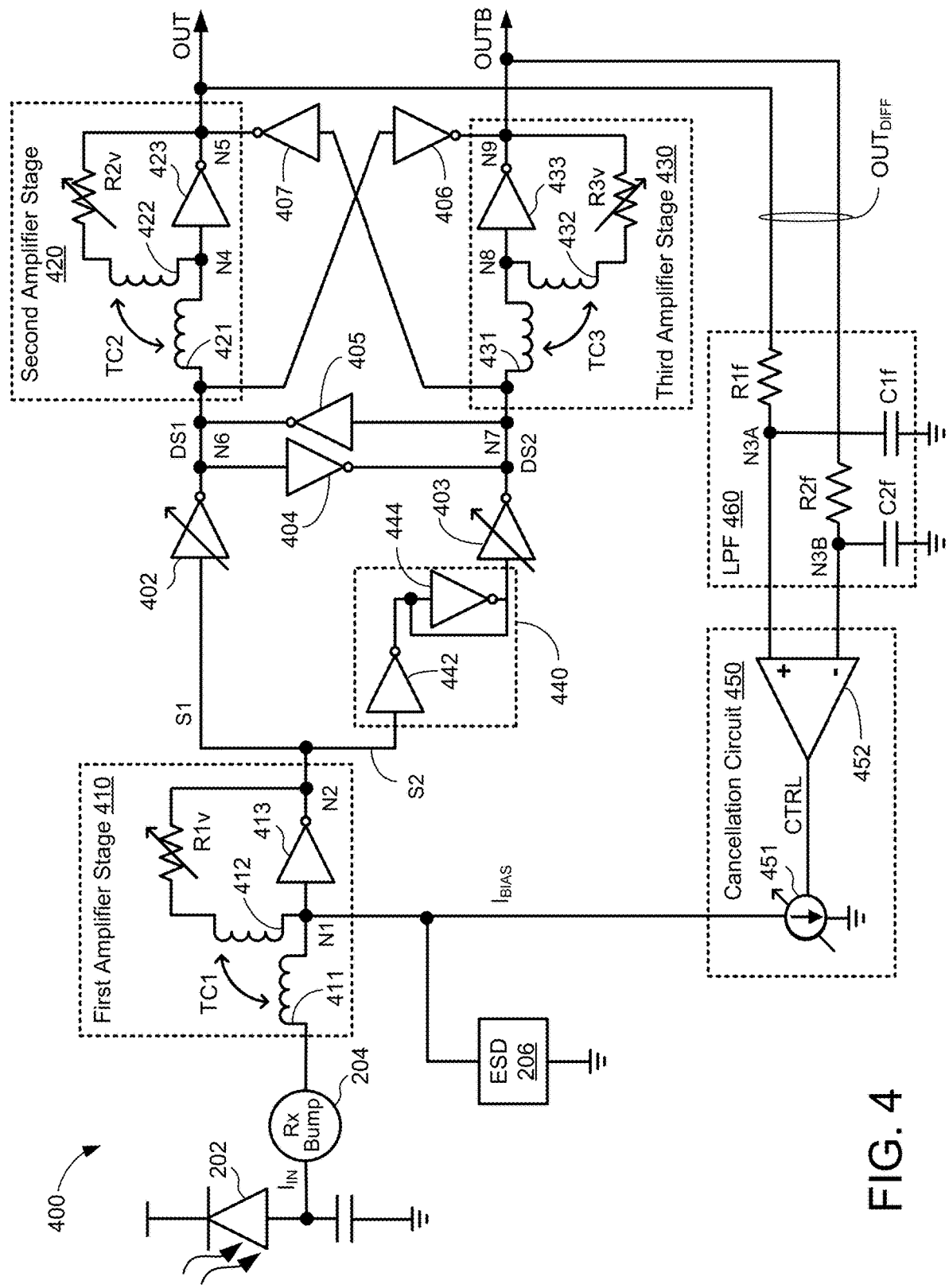
FIG. 4 is a block diagram of another example optical receiver circuit, in accordance with some implementations.

FIG. 4 shows another example optical receiver circuit 400, according to some implementations. The optical receiver circuit 400, which may include many of the components of the optical receiver circuit 200 of FIG. 2 and/or the optical receiver circuit 300 of FIG. 3, may utilize a pseudo-differential signaling scheme to generate a differential output signal formed by the output signal OUT and a logically complemented output signal OUTB. In some implementations, the optical receiver circuit 400 includes a first amplifier stage 410, a second amplifier stage 420, a third amplifier stage 430, a single-ended to differential converter 440, cancellation circuit 450, and a low-pass filer (LPF) 460, as well as the RX bump 204 and the ESD circuit 206 of the examples of FIGS. 2 and 3.

The RX bump 204, which may form an input terminal of the optical receiver circuit 400, receives an input current $I_{IN}$ provided by the photodiode 202. The input current $I_{IN}$, which may be indicative of a number of characteristics of optical signals received by the photodiode 202, is provided to the first amplifier stage 410 via the RX bump 204. The first amplifier stage 410, which may be one implementation of the first amplifier stage 210 of FIGS. 2 and 3, may include a first inductor 411, a second inductor 412, an inverter 413, and a variable resistor R1v. The first inductor 411 is coupled between the RX bump 204 and an input terminal of the inverter 413 (at node N1), and the second inductor 412 is coupled between the input terminal of the inverter 413 and the variable resistor R1v. The variable resistor R1v is coupled between the second inductor 412 and the output terminal of the inverter 413 (at node N2). The output terminal (node N2) of the first amplifier stage 410 may be coupled to an input terminal of the second amplifier stage 420 via a variable inverter 402, and may be coupled to an input terminal of the third amplifier stage 430 via the converter 440 and a variable inverter 403.

The first amplifier stage 410 may receive, amplify, and filter the input signal. In some implementations, the first amplifier stage 410 may be configured to isolate or hide parasitic capacitances associated with the ESD protection circuit 206, parasitic capacitances associated with the bias current, and parasitic capacitances associated with transistor gates (such as transistors that form the inverter 413). In some implementations, the first inductor 411 of the first amplifier stage 410 may be configured to hide input loading on the optical receiver circuit 400, and the second inductor 412 of the first amplifier stage 410 may be configured to increase an effective feedback impedance of the optical receiver circuit 400 at relatively high operating frequencies (such as operating frequencies greater than a threshold value). In some aspects, the inductors 411-412 of the first amplifier stage 410 may form or at least be part of a first inductive circuit TC1 that increases the bandwidth of the optical receiver circuit 400 and/or reduces the power consumption of the optical receiver circuit 400 (as compared to the optical receiver circuit 100 of FIG. 1). In some aspects, the inductive circuit TC1 formed by the first inductor 211 and the second inductor 212 may collectively be referred to as a T-coil inductor, and the first amplifier stage 410 may be referred to as a first T-coil amplifier.

The input terminal of the inverter 413 (at node N1) may be biased by the cancellation circuit 450, for example, to cancel any DC currents present at the input terminal of the first inverter 413 (at node N1). The cancellation circuit 450 may include a current source 451 and an op-amp 452. The current source 451 is coupled between node N1 and ground potential, and may generate a bias current IBIAS that can be adjusted in response to a control signal (CTRL) provided by the op-amp 452. The op-amp 452 includes a non-inverting input terminal coupled to a first output terminal of the LPF 460, an inverting input terminal coupled to a second output terminal of the LPF 460, and an output terminal to provide the control signal CTRL. In some aspects, the op-amp 452 may generate the control signal CTRL based on a differential output signal $OUT_{DIFF}$ formed by OUT and OUTB.

As described below, single-ended output signals generated by the first amplifier stage 410 may be split into first and second signals S1-S2 that can be independently processed by the second amplifier stage 420 and the third amplifier stage 430 to generate respective output signals OUT and OUTB that may form the differential output signal $OUT_{DIFF}$. The variable inverter 402, which is coupled between the first amplifier stage 410 and the second amplifier stage 420, may be configured to delay the first signal S1 by an amount to generate a first delayed signal DS1. In some aspects, the variable inverter 402 may be adjusted, for example, to modify the amount by which the first signal S1 is delayed to generate the first delayed signal DS1.

The converter 440, which includes a first inverter 442 and a second inverter 444 coupled between the first amplifier stage 410 and the third amplifier stage 430 via the variable inverter 403, may be configured to delay the second signal S2. In some implementations, the input and output terminals of the second inverter 444 may be coupled together. The variable inverter 403, which is coupled between the converter 440 and the third amplifier stage 430, may be configured to delay the signal output by the converter 440 by an amount to generate a second delayed signal DS2. In some aspects, the variable inverter 403 may be adjusted, for example, to modify the amount by which the second signal S2 is delayed to generate the second delayed signal DS2.

The second amplifier stage 420 may include a first inductor 421, a second inductor 422, an inverter 423, and a variable resistor R2v. The first inductor 421 is coupled between the variable inverter 402 (at node N6) and an input terminal of the inverter 423 (at node N4), and the second inductor 422 is coupled between the input terminal of the inverter 423 and the variable resistor R2v. The variable resistor R2v is coupled between the second inductor 422 and the output terminal of the second inverter 423 (at node N5). The output terminal of the second amplifier stage 420 (via the inverter 423) may provide the output signal OUT. In some implementations, the output signal OUT may be an output voltage ($V_{OUT}$).

The second amplifier stage 420 may receive, amplify, and filter the first delayed signal DS1 to generate the output signal OUT of the optical receiver circuit 400. In some implementations, the second amplifier stage 420 may be configured to isolate or hide parasitic capacitances associated with the ESD protection circuit 206, parasitic capacitances associated with the bias current, and parasitic capacitances associated with transistor gates (such as transistors that form the inverter 423). In some implementations, the first inductor 421 of the second amplifier stage 420 may be configured to hide input loading, and the second inductor 422 of the second amplifier stage 420 may be configured to increase an effective feedback impedance of the optical receiver circuit 400 at the relatively high operating frequencies. In some implementations, the first inductor 421 and the second inductor 422 may form or at least be part of a second inductive circuit (TC2) that may increase the bandwidth of the optical receiver circuit 400 and/or that may reduce the power consumption of the optical receiver circuit 400, for example, as compared to the optical receiver circuit 100 of FIG. 1. In some aspects, the inductive circuit TC2 formed by the first inductor 421 and the second inductor 422 may collectively be referred to as a T-coil inductor, and the second amplifier stage 420 may be referred to as a T-coil amplifier.

The third amplifier stage 430 may include a first inductor 431, a second inductor 432, an inverter 433, and a variable resistor R3v. The first inductor 431 is coupled between the variable inverter 403 and an input terminal of the inverter 433 (at node N8), and the second inductor 432 is coupled between the input terminal of the inverter 433 and the variable resistor R3v. The variable resistor R3v is coupled between the second inductor 432 and the output terminal of the second inverter 433 (at node N9). The output terminal of the inverter 433 may provide the complementary output voltage VOUTB.

The third amplifier stage 430 may receive, amplify, and filter the second delayed signal DS2 to generate the complemented output signal OUTB of the optical receiver circuit 400. In some implementations, the third amplifier stage 430 may be configured to hide parasitic capacitances associated with the ESD protection circuit 206, parasitic capacitances associated with the bias current, and parasitic capacitances associated with transistor gates (such as transistors that form the inverter 433). In some implementations, the first inductor 431 of the third amplifier stage 430 may be configured to hide input loading, and the second inductor 432 of the third amplifier stage 430 may be configured to increase an effective feedback impedance of the optical receiver circuit 400 at the relatively high operating frequencies. In some implementations, the first inductor 431 and the second inductor 432 may form or at least be part of a third inductive circuit (TC3) that may increase the bandwidth of the optical receiver circuit 400 and/or that may reduce the power consumption of the optical receiver circuit 400, for example, as compared to the optical receiver circuit 100 of FIG. 1. In some aspects, the inductive circuit TC3 formed by the first inductor 431 and the second inductor 432 may collectively be referred to as a T-coil inductor, and the third amplifier stage 430 may be referred to as a T-coil amplifier.

For the example of FIG. 4, the variable resistors R1$v$, R2$v$, and R3$v$ provided within respective amplifier stages 410, 420, and 430 may be adjusted (such as by varying their effective impedances) to tune the resistive feedback characteristics for corresponding inverters 413, 423, and 433. In other implementations, one or more of the variable resistors R1$v$, R2$v$, and R3$v$ may be replaced with a fixed-impedance resistor.

In some implementations, the optical receiver circuit 400 may include a first pair of cross-coupled inverters 404-405, and may include a second pair of cross-coupled inverters 406-407. The first pair of cross-coupled inverters 404-405 may couple the first and second delayed signals DS1 and DS2 together, for example, to increase the speed with which the single-ended signal output from the first amplifier stage 410 can be converted into the delayed signals DS1 and DS2 (and subsequently processed by the second and third amplifier stages 420 and 430 to generate the differential output signal OUT$_{DIFF}$).

The second pair of cross-coupled inverters 406-407 may couple the second and third amplifier stages 420 and 430 together. More specifically, the inverter 406 may be coupled between the input terminal of the second amplifier stage 420 (at node N6) the output terminal of the third amplifier stage 430 (at node N9), for example, to provide the first delayed signal DS1 to the third amplifier stage 430. The inverter 407 may be coupled between the input terminal of the third amplifier stage 430 (at node N7) and the output terminal of the second amplifier stage 420 (at node N5), for example, to provide the second delayed signal DS2 to the second amplifier stage 420. In some aspects, the inverters 406 and 407 may increase gain peaking, and thereby increase the bandwidth of the optical receiver circuit 400 (as compared with the optical receiver circuits 200 and 300 of FIGS. 2 and 3).

The output signals OUT and OUTB generated by respective second and third amplifier stages 420 and 430 may be provided as the differential output signal OUT$_{DIFF}$ to the LPF 460. The LPF 460 includes a first resistor R1$f$, a first capacitor C1$f$, a second resistor R2$f$, and a second capacitor C2$f$. The first resistor R1$f$ is coupled between a first input of the cancellation circuit 450 (at node N3A) and the output terminal of the second amplifier stage 420 (at node N5), and the first capacitor C1$f$ coupled between node N3A and ground potential. The second resistor R2$f$ is coupled between a second input of the cancellation circuit 450 (at node N3B) and the output terminal of the third amplifier stage 430 (at node N9), and the second capacitor C2$f$ is coupled between node N3B and ground potential. In some implementations, the LPF 460 may perform low-pass filtering on each of the differential signal components OUT and OUTB, for example, such that the LPF formed by the first resistor R1$f$ and the first capacitor C1$f$ low-pass filters the output signal OUT, and the LPF formed by the second resistor R2$f$ and the second capacitor C2$f$ low-pass filters the complemented output signal OUTB.

The filtered differential signals may be provided to the cancellation circuit 450. In some implementations, the filtered output signal OUT is provided to the non-inverting input terminal of op-amp 452, and the filtered complementary output signal OUTB is provided to the inverting input terminal of op-amp 452. The op-amp 452 generates the control signal CTRL based on the filtered output signals OUT and OUTB, and the current source 451 may adjust the bias current IBIAs in response to the control signal CTRL, for example, to cancel any DC currents present at the input terminal of the optical receiver circuit 400.

The pseudo-differential output signaling scheme utilized by the optical receiver circuit 400 may suppress noise associated with power supplies (and other sources) more effectively than the single-ended optical receiver circuits 200 and 300 of FIGS. 2 and 3, respectively. In addition, the ability to generate a differential output signal OUT$_{DIFF}$ may allow the optical receiver circuit 400 to operate with other differential components in an associated electro-optical system.

The T-coil architecture of each of the amplifier stages 410, 420, and 430 may also improve the performance of the optical receiver circuit 400. In some implementations, the pair of inductors 411-412 in the first amplifier stage 410 may be identical structures formed in different metal layers of a semiconductor device (not shown for simplicity), and may be aligned or positioned on top of one another, for example, to increase the inductive coupling between the pair of inductors 411-412. Increasing the inductive coupling between the pair of inductors 411-412 may increase the overall inductance of the corresponding inductive circuit TC1, which in turn may increase the ability of the corresponding inductive circuit TC1 to hide parasitic capacitances (such as the parasitic capacitances associated with the ESD protection circuits 206, bias currents, and gate capacitances) and to increase the effective feedback impedance of the first amplifier stage 410 at relatively high operating frequencies.

The pair of inductors 421-422 in the second amplifier stage 420 may also be identical structures formed in different metal layers of a semiconductor device (not shown for simplicity), and may be aligned or positioned on top of one another to increase the inductive coupling between the pair of inductors 421-422. In this manner, the overall inductance of the corresponding inductive circuit TC2 may be increased, which in turn may increase the ability of the corresponding inductive circuit TC2 to hide parasitic capacitances. Similarly, the pair of inductors 431-432 in the third amplifier stage 430 may be identical structures formed in different metal layers of a semiconductor device (not shown for simplicity), and may be aligned or positioned on top of one another to increase the inductive coupling between the pair of inductors 431-432. In this manner, the overall inductance of the corresponding inductive circuit TC3 may be increased, which in turn may increase the ability of the corresponding inductive circuit TC3 to hide parasitic capacitances.

In addition, configuring each of the inductor pairs 411-412, 421-422, and 431-432 to have identical shapes (and sizes) and to be aligned over each other may reduce circuit area, and may also ensure symmetry between the input terminals and output terminals of the respective amplifier stages 410, 420, and 430. The inductive circuits TC1, TC2, and TC3 may also provide inductive coupling between the inputs and outputs of the respective amplifier stages 410, 420, and 430. In some aspects, these inductive couplings may have a high self-resonant frequency reduces capacitive loading on the output resulting from the first and second inductors of each of the inductive circuits TC1, TC2, and TC3.

Figure 5A:
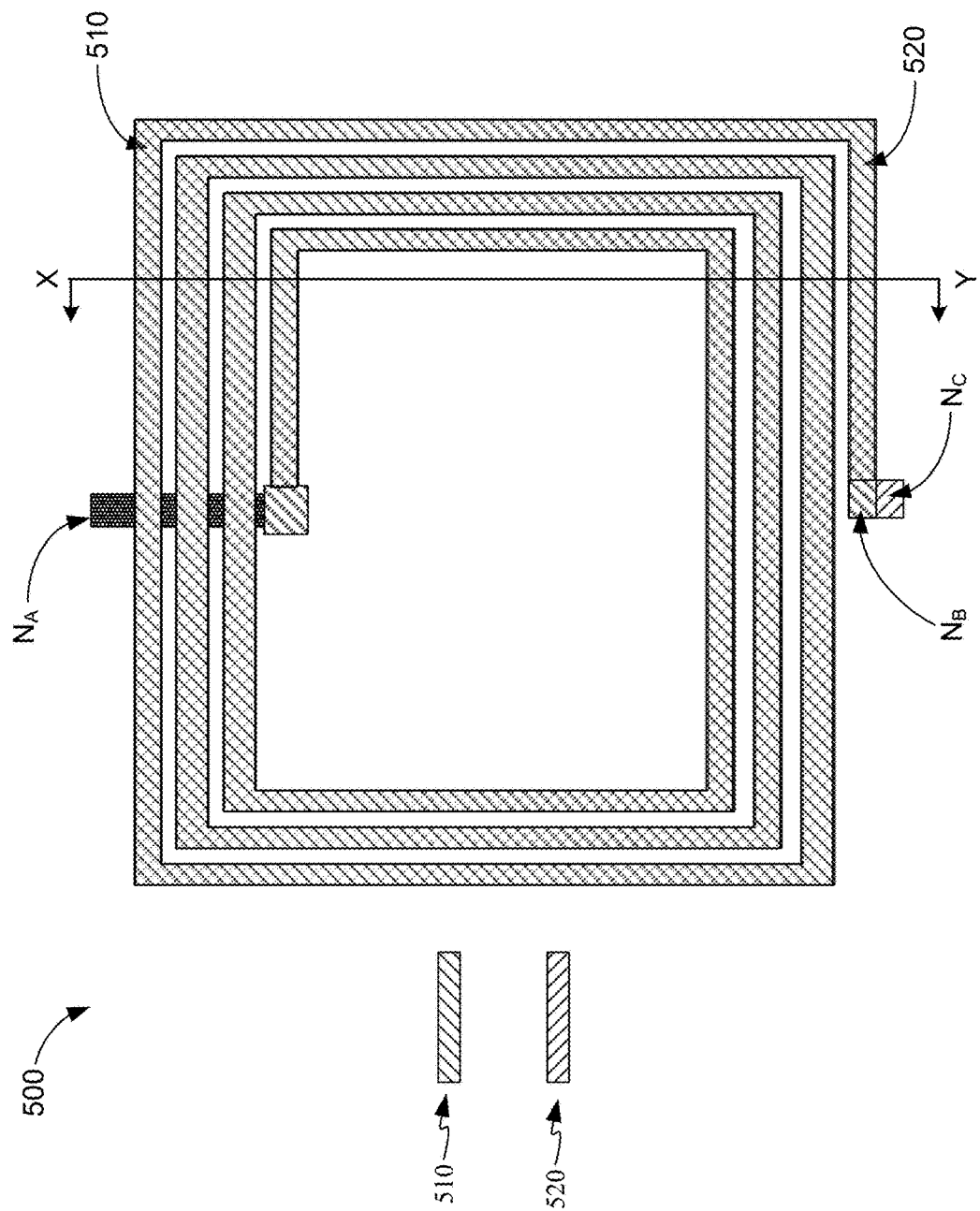
FIG. 5A shows a top plan view of an example inductive circuit that may be used in the optical receiver circuits of FIGS. 2-4, in accordance with some implementations.
Figure 5B:
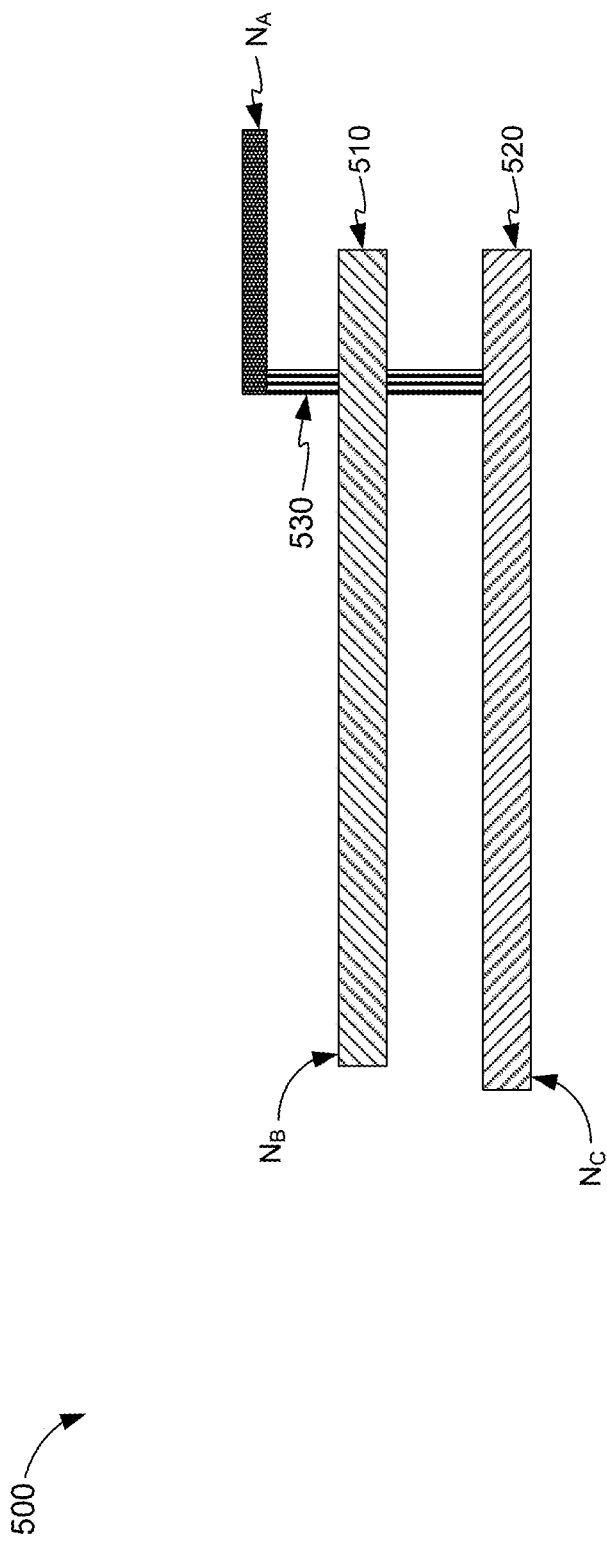
FIG. 5B shows a side plan view of the example inductive circuit of FIG. 5A.

FIG. 5A shows a top plan view of an example inductive circuit 500 in accordance with some implementations, and FIG. 5B shows a side plan view of the example inductive circuit 500 along line XY of FIG. 5A. In some aspects, the inductive circuit 500 may be an example of one or more of the inductive circuits TC1, TC2, and/or TC3. The inductive circuit 500 is shown to include a first inductive coil 510 and a second inductive coil 520. The first inductive coil 510 may be one implementation of the first inductor 211 of FIG. 2, the first inductor 211 of FIG. 3, and/or the first inductors 411, 421, and 431 of FIG. 4, and the second inductive coil 520 may be one implementation of the second inductor 212 of FIG. 2, the second inductor 212 of FIG. 2, and/or the second inductors 412, 422, and 432 of FIG. 4.

As depicted in FIGS. 5A-5B, the first and second inductive coils 510 and 520 each have a rectangular shape of the same size, each include the same number of turns, and each include first ends coupled to a common node NA by a conductive via 530. The first inductive coil 510 includes a second end coupled to a node NB, and the second inductive coil 520 includes a second end coupled to a node Nc. In some implementations, the common node NA may correspond to node N1 of FIGS. 2-4, to nodes N4 of FIGS. 3-4, and/or to node N8 of FIG. 4. In addition, or in the alternative, node NB may correspond to the input terminal of one or more of the amplifier stages 210, 320, 410, 420, or 430, and node Nc may correspond to the junction between the second inductor and the resistor within one or more of the amplifier stages 210, 320, 410, 420, or 430 (such as between inductor 212 and resistor R1, between inductor 322 and resistor R2, between inductor 412 and resistor R1$v$, between inductor 422 and resistor R2$v$, and/or between inductor 432 and resistor R3$v$).

In some implementations, the first and second inductive coils 510 and 520 may be formed in different metal layers and are aligned on top of each other, for example, as depicted in the top plan view of FIG. 5A. Although the example inductive circuit 500 is depicted in FIG. 5A as having a rectangular shape, it is to be understood that the inductive circuit 500 may be of other suitable shapes, sizes, and configurations. For example, in other implementations, the inductive circuit 500 may include inductive coils having a round, octagonal, or other suitable shape.

Simulations have shown that the inductive circuit 500 of FIGS. 5A-5B may have an effective inductance of 450 pH for both of the first and second inductive coils 510 and 520 with a coupling coefficient of 0.74 and may have a relatively high self-resonant frequency (SRF) of approximately 95 GHz. Because the operating frequencies of most optical transceivers are less than 95 GHz, the inductive circuit 500 may provide a negligible amount of capacitive loading on an associated optical receiver circuit (such as any of optical receiver circuits 200, 300, or 400 of FIGS. 2-4).

In many conventional optical receiver circuits, equalization techniques may be required for accurately detecting received signals. Such techniques, such as DFE, may be needed because to counter a noise vs bandwidth tradeoff commonly encountered using conventional optical receivers. That is, amplifying the high-frequency content may additionally amplify noise, and thus may not substantially increase a signal-to-noise ratio (SNR) of the received signal. Such techniques may help to accurately detect received signals but may consume undesirably high amounts of power. Example optical receiver circuits described for example in FIGS. 2-4 may allow for accurate detection of received signals without the use of DFE techniques. For example, use of the T-coil based amplifier stages such as amplifier stages 210, 310, 410, 420, and 430 may allow for greater TIA bandwidth per unit power consumption, as discussed above, helping to enable signal detection without the use of DFE techniques. Further, as discussed below, appropriate selection of optical driver circuits in an optical link may also help to reduce the need for power-hungry techniques such as DFE at the optical receiver.

In many conventional optical receiver circuits, equalization techniques may be required for accurately detecting received signals. Such techniques, such as DFE, may be needed because to counter a noise vs bandwidth tradeoff commonly encountered using conventional optical receivers. That is, amplifying the high-frequency content may additionally amplify noise, and thus may not substantially increase a signal-to-noise ratio (SNR) of the received signal. Such techniques may help to accurately detect received signals but may consume undesirably high amounts of power. Example optical receiver circuits described for example in FIGS. 2-4 may allow for accurate detection of received signals without the use of DFE techniques. For example, use of the T-coil based amplifier stages such as amplifier stages 210, 320, 410, 420, and 430 may allow for greater TIA bandwidth per unit power consumption, as discussed above, helping to enable signal detection without the use of DFE circuitry. Further, as discussed below, appropriate selection of optical driver circuits in an optical link may also help to reduce the need for power-hungry error-correction such as DFE at the optical receiver.

In some implementations, the example optical receiver circuits disclosed herein may be incorporated into a low-power optical link including an optical driver circuit and an optical receiver circuit. For example, the optical receiver circuits disclosed herein may be used in combination with an optical driver circuit similar to that described in U.S. patent application Ser. No. 15/862,058, which is hereby incorporated by reference in its entirety. In some aspects, such an optical driver circuit may enable the optical driver circuit to achieve faster rising and falling edge transitions of output signals without voltage swing degradations of conventional optical driver circuits. In some aspects, non-linear distortion caused by an electro-optical converter may be compensated for by independently adjusting the rising and falling edge transitions of the output signals. In some aspects, such an optical driver circuit may include an inductive circuit configured to reduce parasitic capacitances during edge transitions of the electrical output signal. Such optical driver circuits may additionally include a first control signal to selectively adjust the speed or duration of rising edge transitions of the output signal, and a second control signal to selectively adjust the speed or duration of falling edge transitions of the output signal. In this manner, the optical driver circuit may compensate for asymmetric responses of electro-optical converters to rising and rising edge transitions of output signals generated by the optical driver circuits.

Figure 6:
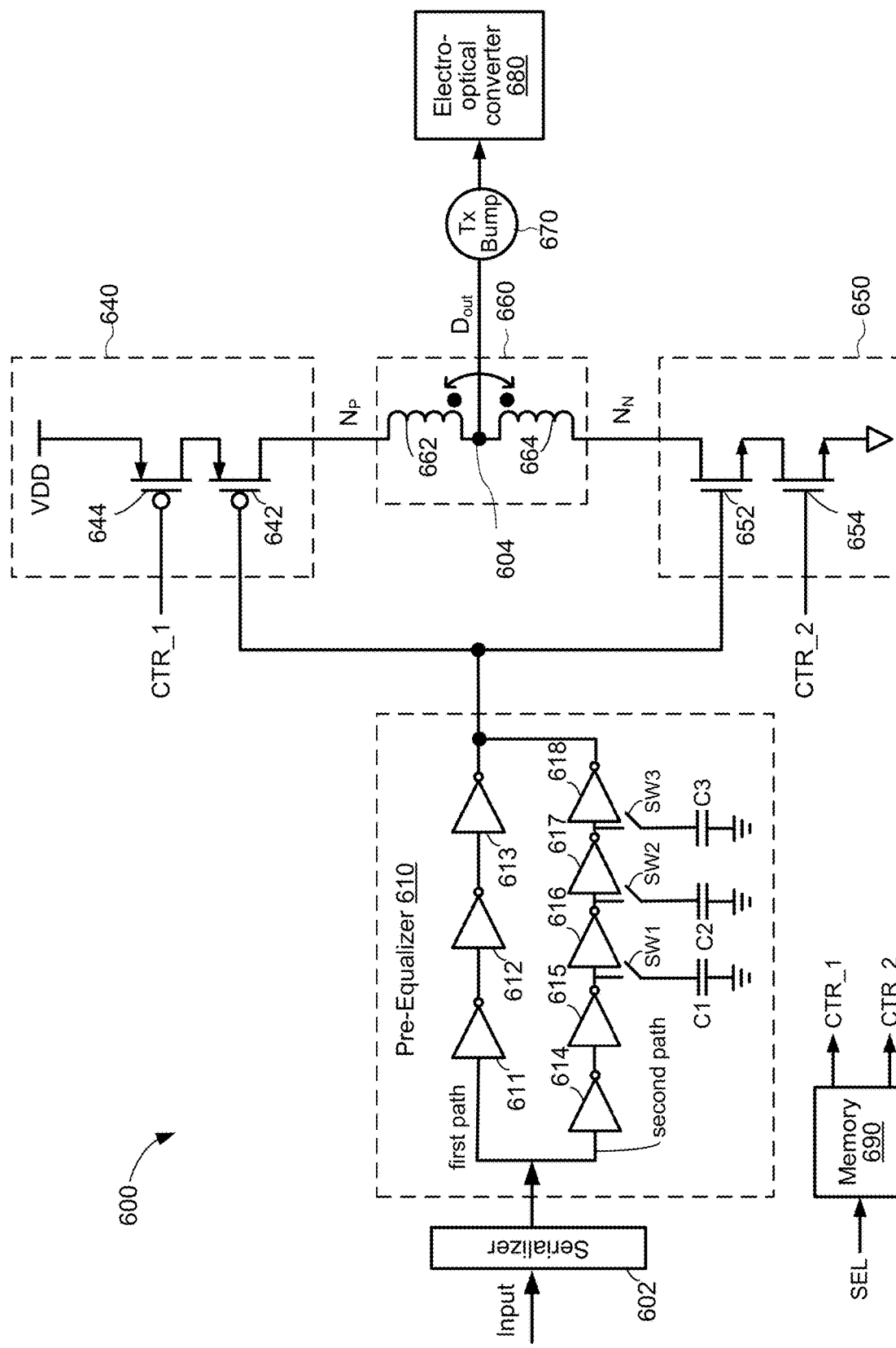
FIG. 6 is a block diagram of an example optical driver circuit which may form part of a low-power optical link, according to some implementations.

FIG. 6 shows an optical driver circuit 600 which may form part of a low-power optical link, according to some implementations. The optical driver circuit 600 may include a serializer 602, a pre-equalization circuit 610, a PMOS pull-up circuit 640, an NMOS pull-down circuit 650, an inductive circuit 660, a TX bump 670, and an electro-optical converter 680. An input data stream, which may be received from a parallel interface (such as a low-power parallel interface), may be provided to the serializer 602. The serializer 602 may generate a serial bitstream based on the received input data stream, and the pre-equalization circuit 610 may equalize the serial bitstream. In some implementations, the pre-equalization circuit 610 may be a programmable sub-unit interval (UI) pre-equalization circuit that includes a plurality of inverters and capacitors.

For the example of FIG. 6, the pre-equalization circuit 610 may be configured to allow for larger fanout of pre-driver stages without significantly increasing inter-symbol interference (ISI) jitter. This may allow for an output signal of the optical driver circuit 600 to have an increased bandwidth. The pre-equalization circuit 610 includes a plurality of first inverters 611-613 coupled in series along a first signal path, and includes a plurality of second inverters 614-618 coupled in series along a second signal path that is parallel to the first signal path. The pre-equalization circuit 610 also includes a plurality of capacitors C1, C2, and C3 that can selectively couple the second signal path to ground potential via respective switches SW1, SW2, and SW3. In some implementations, one or more of the plurality of capacitors C1, C2, and C3 may be coupled to the second path via corresponding switches SW1, SW2, and SW3. Although the first path is shown to include three inverters 611-613 and the second path is shown to include five inverters 614-618, in other implementations, the first and second paths may have other numbers of inverters. Similarly, although three capacitors C1, C2, and C3 are shown to be selectively coupled between the second path and ground potential, in other implementations, other numbers of capacitors may be selectively coupled between the second path and ground potential.

The equalized output signal provided by the pre-equalization circuit 610 may be provided to the PMOS pull-up circuit 640 and to the NMOS pull-down circuit 650. The respective outputs of the PMOS pull-up circuit 640 and the NMOS pull-down circuit 650 may be provided to the inductive circuit 660. The output of the inductive circuit 660, at an output terminal 604, may be coupled to the electro-optical converter 680 via the TX bump 670, and the electro-optical converter 680 which may be coupled to an optical receiver circuit via an optical medium (not shown in FIG. 6 for simplicity).

The PMOS pull-up circuit 640 and NMOS pull-down circuit 650 may allow the optical driver circuit 600 to achieve faster rising and falling edge transitions of output signals without voltage swing degradations of conventional optical driver circuits. In some aspects, non-linear distortion caused by the electro-optical converter 680 may be compensated for by independently adjusting the rising and falling edge transitions of the output signals.

In some implementations, the PMOS pull-up circuit 640 may include a first PMOS transistor 642 and a second PMOS transistor 644. The first PMOS transistor may have a gate terminal coupled to the output of pre-equalization circuit 610, a source terminal coupled to a drain terminal of the second PMOS transistor 644, and a drain terminal coupled to an output of the PMOS pull-up circuit 640. The second PMOS transistor 644 may have a gate terminal coupled to a first control signal CTR_1, a source terminal coupled to a supply voltage VDD, and a drain terminal coupled to the source terminal of the first PMOS transistor 642. As discussed above, the first control signal CTR_1 may be configured to selectively adjust the speed or duration of rising edge transitions of an output signal $D_{out}$ of the optical driver circuit 600.

The NMOS-pull-down circuit 650 may include a first NMOS transistor 652 and a second NMOS transistor 654. The first NMOS transistor may have a gate terminal coupled to the output of pre-equalization circuit 610, a source terminal coupled to a drain terminal of the second NMOS transistor 654, and a drain terminal coupled to an output of the NMOS pull-down circuit 650. The second NMOS transistor 654 may have a gate terminal coupled to a second control signal CTR_2, a source terminal coupled to a ground potential, and a drain terminal coupled to the source terminal of the first NMOS transistor 652. As discussed above, the second control signal CTR_2 may be configured to selectively adjust the speed or duration of falling edge transitions of the output signal $D_{out}$.

As mentioned above, the first control signal CTR_1 may be used to control or adjust rising edge transitions of the output signal $D_{out}$, and the second control signal CTR_2 may be used to control or adjust falling edge transitions of the output signal $D_{out}$. More specifically, the PMOS pull-up circuit 640 may be configured to adjust rising edge transitions of the output signal $D_{out}$ based on the first control signal CTR_1, and the NMOS pull-down circuit 650 may be configured to adjust falling edge transitions of the output signal $D_{out}$ based on the second control signal CTR_2. In some aspects, the PMOS pull-up circuit 640 and the NMOS pull-down circuit 650 may control or adjust rising edge transitions of the output signal $D_{out}$ and falling edge transitions of the output signal $D_{out}$, respectively, independently of each other.

In some implementations, the first and second control signals CTR_1 and CTR_2 may be based at least in part on information indicating the asymmetric responses of the electro-optical converter 680 to rising and falling edge transitions of the output signal $D_{out}$. In this manner, the speed of rising edge transitions of the output signal $D_{out}$ and/or the speed of falling edge transitions of the output signal $D_{out}$ may be adjusted by the first and second control signals CTR_1 and CTR_2, respectively, to provide pre-emphasis in the output signal $D_{out}$ to compensate for non-linearities inherent in the electro-optical converter 680.

More specifically, the first control signal CTR_1 may independently control or adjust the speed with which the PMOS pull-up circuit 640 pulls the output terminal 604 high towards VDD during rising edge transitions of the output signal $D_{out}$ by selectively adjusting the gate voltage of PMOS transistor 644. For example, a voltage of the first control signal CTR_1 may be decreased (such as to a less positive voltage) to increase current flow through PMOS transistor 644 and thereby increase the speed of rising edge transitions of the output signal $D_{out}$, and the voltage of the first control signal CTR_1 may be increased (such as to a more positive voltage) to decrease current flow through PMOS transistor 644 and thereby decrease the speed of rising edge transitions of the output signal $D_{out}$.

Similarly, the second control signal CTR_2 may independently control or adjust the speed with which the NMOS pull-up circuit 650 pulls the output terminal 604 low towards ground potential during falling edge transitions of the output signal $D_{out}$ by selectively adjusting the gate voltage of NMOS transistor 654. For example, a voltage of the second control signal CTR_2 may be increased (such as to a more positive voltage) to increase current flow through NMOS transistor 654 and thereby increase the speed of falling edge transitions of the output signal $D_{out}$, and the voltage of the second control signal CTR_2 may be decreased (such as to a less positive voltage) to decrease current flow through NMOS transistor 654 and thereby decrease the speed of falling edge transitions of the output signal $D_{out}$. In this manner, the optical driver circuit 600 may cause the rising and falling edge transitions of the output signal $D_{out}$ to exhibit an asymmetry that compensates for asymmetrical responses of the electro-optical converter 680.

The first and second control signals CTR_1 and CTR_2 may be generated by any suitable circuit provided within or coupled to the optical driver circuit 600. For the example depicted in FIG. 6, the optical driver circuit 600 may include a memory 690 configured to provide or generate the first and second control signals CTR_1 and CTR_2. The memory 690 may be any suitable memory circuit or storage device (such as non-volatile memory) that can store voltage levels or values indicative of voltage levels for the first and second control signals CTR_1 and CTR_2. In some implementations, the memory 690 may store a plurality of voltages or values for each of the first and second control signals CTR_1 and CTR_2. The voltages or values stored in the memory 690 for the first and second control signals CTR_1 and CTR_2 may be based on asymmetric response behavior of the electro-optical converter 680. In some aspects, the asymmetric response behavior of the electro-optical converter 680 may be determined using eye diagrams, for example, as described below with respect to FIG. 8. In other aspects, the electro-optical converter 680 may provide a feedback signal (not shown for simplicity) indicating its asymmetric response to rising and falling edge transitions of the output signal $D_{out}$, and the feedback signal may be used to select and/or update voltages or values for each of the first and second control signals CTR_1 and CTR_2 stored in the memory 690.

The memory 690 may be programmed by a manufacturer of the optical driver circuit 600, by a tester of the optical driver circuit 600, by a user of the optical driver circuit 600, or any combination thereof. In some aspects, the memory 690 may be programmed with suitable values for the first and second control signals CTR_1 and CTR_2 in the field (such as by manual programming or by an over the air (OTA) update). In addition, or in the alternative, values stored in the memory 690 for the first and second control signals CTR_1 and CTR_2 may be dynamically updated in the field.

In some other implementations, the memory 690 may be or include a look-up table (LUT) to store multiple voltages or values for each of the first and second control signals CTR_1 and CTR_2 that can be selected, for example, in response to a select signal (SEL). The select signal SEL may be based on, or may indicate, a desired edge transition setting that compensates for the asymmetric response of the electro-optical converter 680. In this manner, the optical driver circuit 600 may provide a level of pre-emphasis in the output signal $D_{out}$ to compensate for non-linearities in the electro-optical converter 680.

Parasitic capacitances within or associated with PMOS transistors 642-644 and NMOS transistors 652-654 may undesirably increase the capacitive load on the output terminal 604 of the optical driver circuit 600. For example, certain P-N junctions within PMOS transistor 642 (such as the P-N junction between the drain and body of NMOS transistor 642 and the P-N junction between the source and body of PMOS transistor 642) may form body diodes having parasitic capacitances. Similarly, certain N-P junctions within NMOS transistor 654 (such as the N-P junction between the drain and body of NMOS transistor 654 and the N-P junction between the source and body of NMOS transistor 654) may form body diodes having parasitic capacitances.

The inductive circuit 660 may include a first inductor 662 and a second inductor 664 connected in series between the PMOS pull-up circuit 640 and the NMOS pull-down circuit 650. As depicted in FIG. 6, the first inductor 262 is coupled between the source of PMOS transistor 642 and the output terminal 604, and the second inductor 664 is coupled between the drain of NMOS transistor 652 and the output terminal 604. In some implementations, the first and second inductors 662-664 may each be of the same size and shape, and may be stacked on top of each other, for example, as described in more detail above with respect to FIGS. 5A-5B. In this manner, the first and second inductors 662-664 may be electromagnetically coupled to each other, thereby resulting in a mutual inductance between the first and second inductors 662-664 that may increase the overall inductance of the inductive circuit 660. In some aspects, the mutual inductance between the first and second inductors 662-664 may be based at least in part on a distance separating the first and second inductors 662-664.

In accordance with aspects of the present disclosure, the inductive circuit 660 may reduce or isolate parasitic capacitances within the PMOS pull-up circuit 640 and the NMOS pull-down circuit 650, thereby allowing for faster edge transitions in the output signal $D_{out}$ by reducing the overall load capacitance of the optical driver circuit 600. More specifically, the first inductor 662 may reduce or isolate parasitic capacitances within the PMOS pull-up circuit 640 during rising edge transitions of the output signal $D_{out}$, and the second inductor 664 may reduce or isolate parasitic capacitances within the NMOS pull-down circuit 650 during falling edge transitions of the output signal $D_{out}$.

Moreover, the ability of the inductive circuit 660 to prevent parasitic capacitances from capacitively loading the output terminal 604 during edge transitions of the output signal $D_{out}$ may improve as operating frequencies increase and/or as the edge transitions of the output signal $D_{out}$ become sharper. For example, as the operating frequency of the optical driver circuit 600 increases, the impedances of the first and second inductors 662 and 664 also increase. As a result, the first inductor 662 may become even more effective in preventing parasitic capacitances associated with the PMOS pull-up circuit 640 from capacitively loading the output terminal 604, and the second inductor 664 may become even more effective in preventing parasitic capacitances associated with the NMOS pull-down circuit 650 from capacitively loading the output terminal 604.

Figure 7:
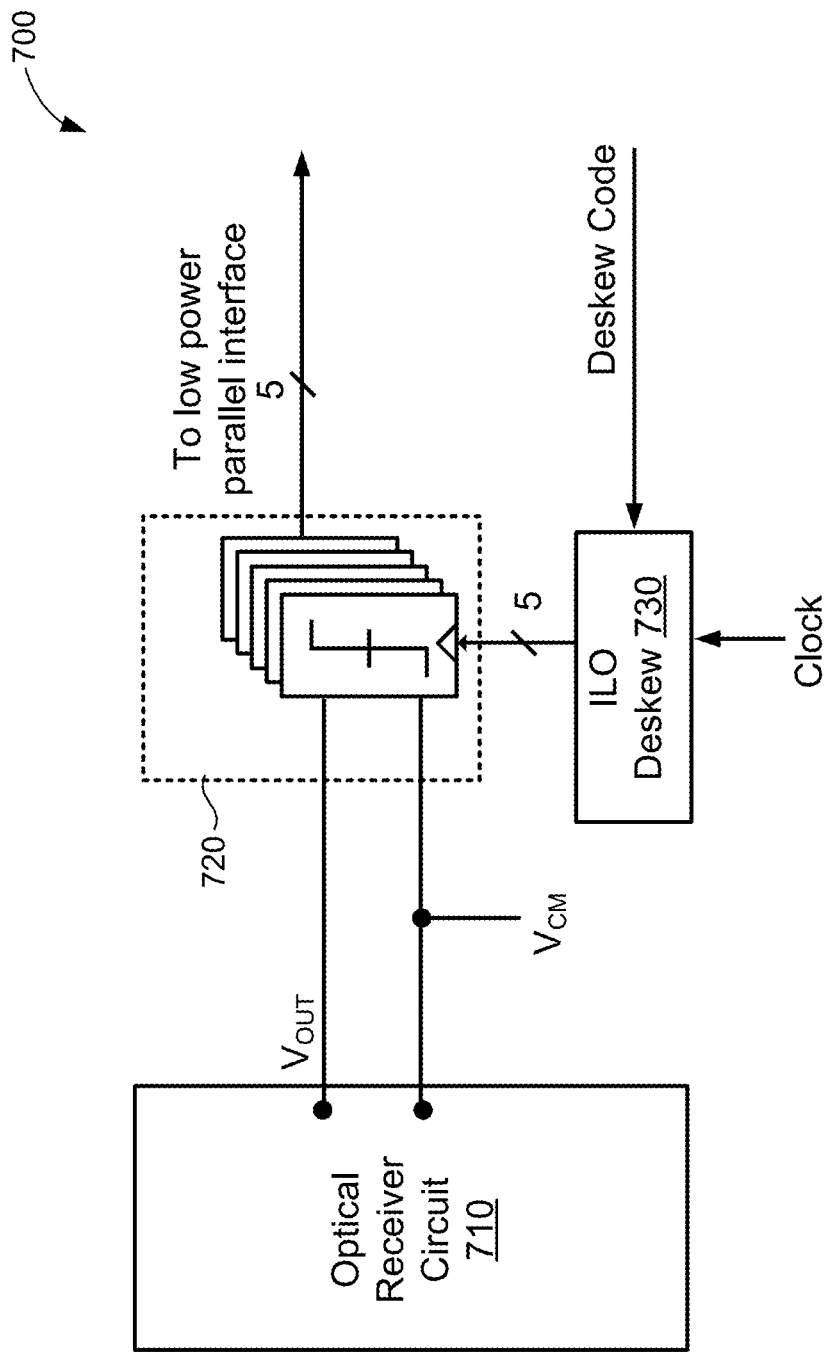
FIG. 7 is a block diagram of an example optical receiver circuit which may form part of a low-power optical link, according to some implementations.

In some implementations the optical driver circuit 600 may transmit optical signals via the optical medium, which may then be received by an optical receiver which may incorporate one or more optical receiver circuits, such as depicted in FIG. 2 or FIG. 3. For example, FIG. 7 shows an optical receiver 700 that includes an optical receiver circuit 710, a slicer circuit 720, and an injection-locked oscillator (ILO) deskew circuit 730. The optical receiver circuit 710 may be an optical receiver circuit including one or more T-coil based amplifier stages, such as optical receiver circuit 200 or 300 as described above with respect to FIGS. 2 and 3. The optical signals transmitted via the optical medium from the optical driver circuit may be received using the optical receiver circuit 710. As described above, the optical receiver circuit 700 may output an output voltage Vout and may receive a common mode voltage Vcm. The slicer circuit 720 may receive Vout and a plurality of deskew timing signals and generate an output signal which may be provided to a low-power interface, such as a low-power parallel interface. In some implementations, the slicer circuit may receive a plurality of 5 deskew timing signals and generate a parallel output signal 5 bits wide. In some implementations 4 slicers may be clocked by 4 phases of a quarter-rate clock, and thus 4 of the 5 deskew timing signals may be these 4 phases of the quarter-rate clock. The fifth slicer may be an error slicer, which samples a peak of the input signal. This error slicer may be used in combination with the data samples to implement a baud-rate clock and data recovery (CDR) loop. Such a CDR loop may digitally control a delay adjustment (deskew) block implemented using an injection-locked oscillator (ILO), such as a div-2 ILO. Such digital adjustment may help to adjust one or more sampling clocks of the optical driver circuit 600 to their optimal positions. In some implementations that ILO deskew circuit 720 may receive a deskew code input signal and a forward (FWD) clock signal in order to generate the plurality of deskew timing signals.

In some implementations, example optical links such as depicted in FIGS. 6 and 7 may allow for power-efficient and low-error performance without the use of DFE circuitry. In some implementations, example optical links may operate at 56 GB/s using non-return-to-zero (NRZ) formatted serial communications mechanisms. In some other implementations other serial communications such as non-return-to-zero inverted (NRZI) or pulse amplitude modulation (PAM) techniques such as PAM-4. In some implementations the example driver circuit 600 may operate with VDD=0.9 V. As discussed above, control signals may control rising and falling edges of the output signal using PMOS pull-up circuit 640 and the NMOS pull-down circuit 650. This may allow for increased "peaking" or increased voltage peaks associated with rising and falling edges of the output signal $D_{out}$. This increased peaking (or "over-peaking") may improve the power-efficiency of the optical link by helping to relax the bandwidth requirements of the TIA at the optical receiver, and additionally helping to reduce a laser power requirement at the electro-optical converter 680.

As described, the example optical receivers 200, 300, and 400 disclosed herein may increase bandwidth at relatively high operating frequencies (such as compared to the optical receiver circuit 100 of FIG. 1), and their use in optical receivers such as the optical receiver circuit 700 may eliminate the need for high-power error correction circuitry (such as DFE circuitry). In this manner, the optical links disclosed herein may allow for accurate performance while consuming less power than conventional optical links.

Figure 8:
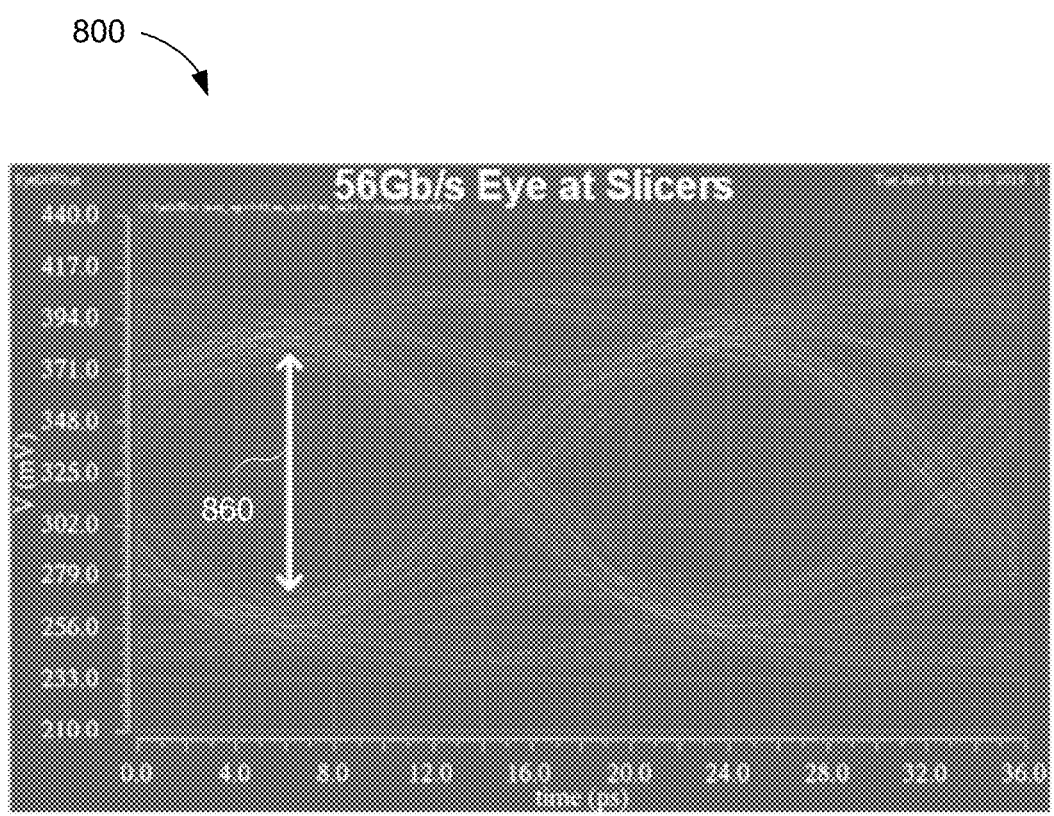
FIG. 8 shows an example eye diagram for the optical receiver circuit of FIG. 7, according to some implementations.

As described above, the inductive circuits disclosed herein (such as the inductive circuit 500 with respect to optical driver and receiver circuits, such as the T-coil based amplifier stages 210, 320, 410, 420, and 430, and the inductive circuit 660 may increase a vertical eye-opening, for example, as compared with conventional optical driver and receiver circuits. For example, FIG. 8 depicts an example eye diagram 800 associated with the optical receiver circuit 700 of FIG. 7 at a data rate of approximately 56 Gbps. The optical receiver circuit 700 exhibits a vertical eye-opening 860 of approximately 100 millivolts. Simulations of the optical link depicted with respect to FIGS. 6 and 7 estimate a noise variance of approximately 6.7 millivolts at the slicer circuit 720. Such simulations show sufficiently high signal to noise ratios to allow the example optical link to detect received signals at low bit error rates without requiring the use of power-hungry techniques such as DFE.

Figure 9:
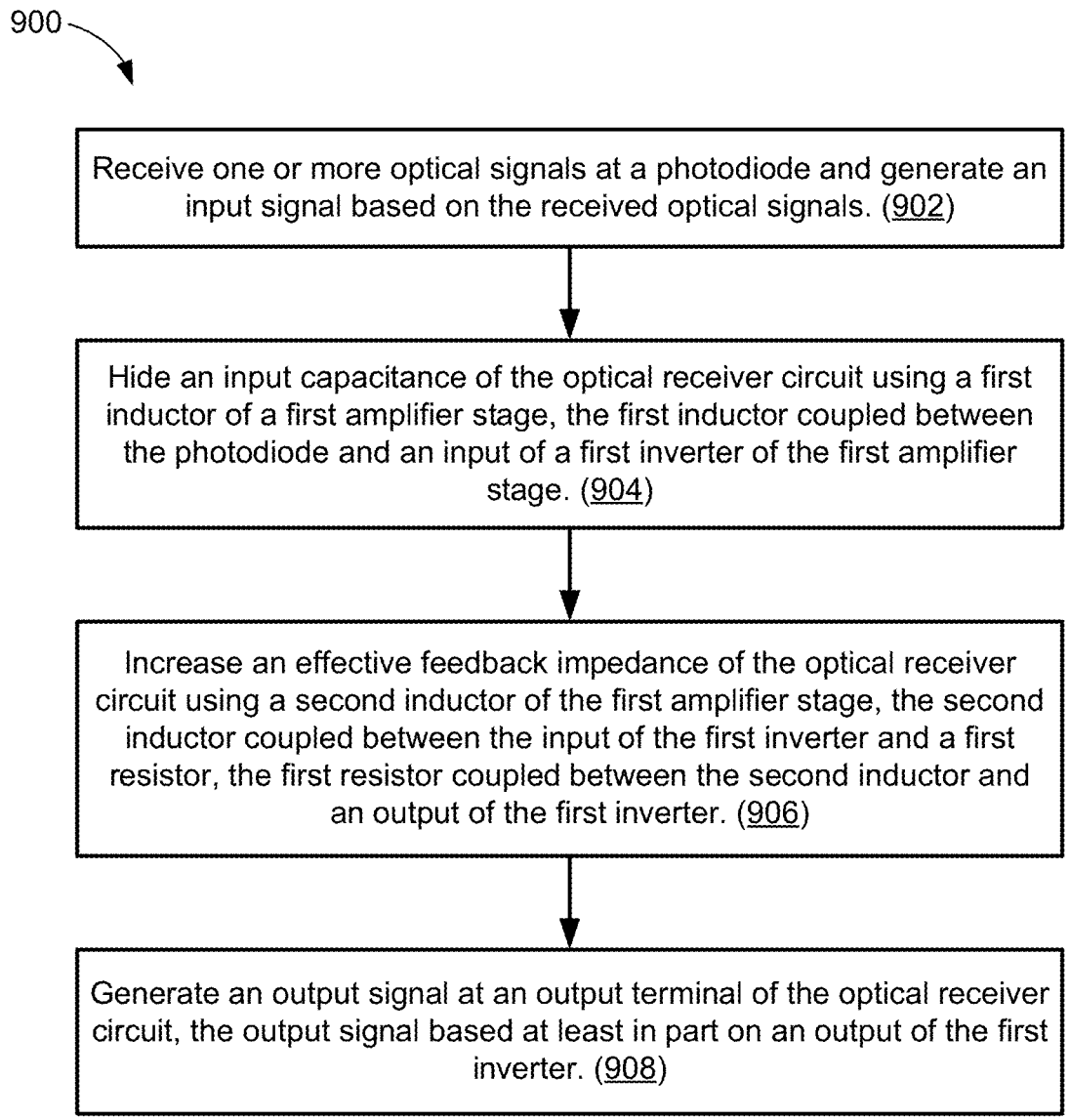
FIG. 9 is an illustrative flow chart depicting an example operation for operating an optical receiver circuit, according to the example implementations.

FIG. 9 is an illustrative flowchart depicting an example operation 900 for operating an optical receiver circuit, according to some implementations. Although described below with respect to the optical receiver circuit 200 of FIG. 2, the example operation 900 may be performed by any suitable optical receiver circuit including, for example, the optical receiver circuit 300 of FIG. 3 and/or the optical receiver circuit 400 of FIG. 4. First, the optical receiver circuit 200 may receive one or more optical signals at a photodiode 202 and generate an input signal based on the received optical signals (902). In some aspects the input signal may be sent through an Rx bump to a first amplifier stage. The optical receiver circuit 200 may hide an input capacitance of the optical receiver circuit using a first inductor of a first amplifier stage, where the first inductor is coupled between the photodiode and an input of a first inverter of the first amplifier stage (904). The optical receiver circuit 200 may increase an effective feedback impedance of the optical receiver circuit using a second inductor of the first amplifier stage, where the second inductor is coupled between the input of the first inverter and a first resistor, and the first resistor is coupled between the second inductor and an output of the first inverter (906). The optical receiver circuit 200 may then generate an output signal at an output terminal of the optical receiver circuit, where the output signal is based at least in part on an output of the first inverter (908).

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example implementations have been described with reference to specific example implementations thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

This disclosure may also include:
1. An optical driver circuit, comprising:
   an input terminal to receive an input signal;
   an output terminal to generate an output signal;
   a pull-up transistor coupled between the output terminal and a first voltage supply, the pull-up transistor including a gate responsive to the input signal and including a source terminal inductively coupled to the output terminal via a first inductor; and
   a pull-down transistor coupled between the output terminal and a second voltage supply, the pull-down transistor including a gate responsive to the input signal and including a source terminal inductively coupled to the output terminal via a second inductor,
   wherein the first and second inductors form an inductive circuit configured to isolate parasitic capacitances in the pull-up transistor from the output terminal and to isolate parasitic capacitances in the pull-down transistor from the output terminal.
2. The optical driver circuit of claim 1, further comprising:
   a first transistor coupled between the pull-up transistor and the first voltage supply and including a gate to receive a first control signal; and
   a second transistor coupled between the pull-down transistor and the second voltage supply and including a gate to receive a second control signal.
3. The optical driver circuit of claim 2, wherein the first and second control signals are based on an asymmetric response of an associated electro-optical converter to rising and falling edge transitions of the output signal.
4. The optical driver circuit of claim 2, further comprising:
   a memory configured to store a number of values for each of the first and second control signals, wherein a speed of the rising edge transitions of the output signal is based at least in part on a selected value of the first control signal, and a speed of the falling edge transitions of the output signal is based at least in part on a selected value of the second control signal.
5. The optical driver circuit of claim 1, wherein the first inductor is configured to isolate parasitic capacitances in the pull-up circuit from the output terminal during falling edge transitions of the output signal, and the second inductor is configured to isolate parasitic capacitances in the pull-down circuit from the output terminal during rising edge transitions of the output signal.
6. The optical driver circuit of claim 1, wherein during falling edge transitions of the output signal, an impedance of the first inductor is increased based at least in part on higher-frequency components of the output signal.
7. The optical driver circuit of claim 1, wherein during rising edge transitions of the output signal, an impedance of the second inductor is increased based at least in part on higher-frequency components of the output signal.
8. The optical driver circuit of claim 1, wherein the first and second inductors are coupled in series with each other, the first inductor comprises a first inductive coil formed in a first metal layer of a semiconductor device, the second inductor comprises a second inductive coil formed in a second metal layer of the semiconductor device, and the first and second inductive coils are aligned with each other.
9. The optical driver circuit of claim 8, wherein first ends of the first and second inductive coils are coupled to the output terminal by a via formed in the semiconductor device, and second ends of the first and second inductive coils are aligned with each other.
10. A method for operating an optical driver circuit including at least an input terminal, an output terminal, a pull-up circuit, and a pull-down circuit, the method comprising:
    receiving an input signal at the input terminal;
    generating an output signal based at least in part on the input signal;
    adjusting rising edge transitions of the output signal based on a first control signal;
    adjusting falling edge transitions of the output signal based on a second control signal;
    isolating parasitic capacitances in the pull-down circuit from the output terminal during the rising edge transitions of the output signal using a first inductor; and
    isolating parasitic capacitances in the pull-up circuit from the output terminal during falling edge transitions of the output signal using a second inductor.
11. The method of claim 10, wherein the rising edge transitions and the falling edge transitions are adjusted independently of each other.
12. The method of claim 10, further comprising:
    configuring the first and second control signals to introduce asymmetry between the rising and falling edge transitions of the output signal.
13. The method of claim 10, further comprising:
    determining an asymmetric response of an electro-optical converter to the rising and falling edge transitions of the output signal; and
    selecting values for the first and second control signals based on the determined asymmetric response.
14. The method of claim 13, further comprising:
    storing the selected values for the first and second control signals in a memory.
15. The method of claim 13, wherein a speed of the rising edge transitions of the output signal is based at least in part on the selected value of the first control signal, and a speed of the falling edge transitions of the output signal is based at least in part on the selected value of the second control signal.
16. The method of claim 10, further comprising:
    during falling edge transitions of the output signal, increasing an impedance of the first inductor based at least in part on higher-frequency components of the output signal.
17. The method of claim 10, further comprising:
    during rising edge transitions of the output signal, increasing an impedance of the second inductor based at least in part on higher-frequency components of the output signal.
18. The method of claim 10, wherein the first inductor and the second inductor form an inductive circuit coupled across the output terminal.
19. The method of claim 10, wherein the first and second inductors are coupled in series with each other, the first inductor comprises a first inductive coil formed in a first metal layer of a semiconductor device, the second inductor comprises a second inductive coil formed in a second metal layer of the semiconductor device, and the first and second inductive coils are aligned with each other.

20. The method of claim 19, wherein first ends of the first and second inductive coils are coupled to the output terminal by a via formed in the semiconductor device, and second ends of the first and second inductive coils are aligned with each other.

What is claimed is:

1. An optical receiver circuit, comprising:
    an input terminal to receive an input signal indicative of information contained in an optical signal;
    an output terminal to provide an output signal based at least in part on the input signal; and
    a first amplifier stage coupled between the input and output terminals of the optical receiver circuit, the first amplifier stage comprising:
        a first inverter including an output coupled to the output terminal of the optical receiver circuit;
        a first inductor coupled between the input terminal of the optical receiver circuit and an input of the first inverter; and
        a second inductor and a first resistor coupled between the input and the output of the first inverter;
    a single-ended to differential conversion circuit coupled to an output of the first amplifier stage and configured to generate first and second delayed signals based at least in part on the input signal, wherein the first and second delayed signals form a differential signal indicative of the input signal;
    a second amplifier stage coupled to the single-ended to differential conversion circuit and configured to generate a first component of a differential output signal based at least in part on the first delayed signal; and
    a third amplifier stage coupled to the single-ended to differential conversion circuit and configured to generate a second component of the differential output signal based at least in part on the second delayed signal.

2. The optical receiver circuit of claim 1, wherein the first inductor is configured to isolate or hide parasitic capacitances associated with the input terminal of the optical receiver circuit, and the second inductor is configured to increase an effective feedback impedance of the optical receiver circuit at one or more operating frequencies.

3. The optical receiver circuit of claim 1, wherein the first and second inductors are coupled in series with each other, the first inductor comprises a first inductive coil formed in a first metal layer of a semiconductor device, the second inductor comprises a second inductive coil formed in a second metal layer of the semiconductor device, and the first and second inductive coils are aligned with each other.

4. The optical receiver circuit of claim 3, wherein first ends of the first and second inductive coils are coupled to the input of the first inverter by a via formed in the semiconductor device, and second ends of the first and second inductive coils are aligned with each other.

5. The optical receiver circuit of claim 1, further comprising:
    a low-pass filter (LPF) coupled to the output terminal and configured to generate a filtered output signal; and
    a cancellation circuit configured to adjust a bias current at the input of the first inverter based on the filtered output signal and a common-mode voltage.

6. The optical receiver circuit of claim 1, further comprising a second amplifier stage coupled between the first amplifier stage and the output terminal of the optical receiver circuit, the second amplifier stage comprising:
    a second inverter including an output coupled to the output terminal of the optical receiver circuit;
    a third inductor coupled between the first amplifier stage and an input of the second inverter; and
    a fourth inductor and a second resistor coupled between the input and the output of the second inverter.

7. The optical receiver circuit of claim 6, wherein the third and fourth inductors are coupled in series with each other, the third inductor comprises a third inductive coil formed in a first metal layer of a semiconductor device, the fourth inductor comprises a fourth inductive coil formed in a second metal layer of the semiconductor device, and the third and fourth inductive coils are aligned with each other.

8. The optical receiver circuit of claim 7, wherein first ends of the third and fourth inductive coils are coupled to the input of the second inverter by a via formed in the semiconductor device, and second ends of the third and fourth inductive coils are aligned with each other.

9. The optical receiver circuit of claim 1, wherein the second amplifier stage includes an output coupled to an input of the third amplifier stage, the second amplifier stage comprising:
    a second inverter including an output coupled to the output terminal of the optical receiver circuit;
    a third inductor coupled between the first amplifier stage and an input of the second inverter; and
    a fourth inductor and a second resistor coupled between the input and the output of the second inverter.

10. The optical receiver circuit of claim 9, wherein the third amplifier stage includes an output coupled to the input of the second amplifier stage, the third amplifier stage comprising:
    a third inverter including an output coupled to a complementary output terminal of the optical receiver circuit;
    a fifth inductor coupled between the first amplifier stage and an input of the third inverter; and
    a sixth inductor and a third resistor coupled between the input and the output of the third inverter.

11. The optical receiver circuit of claim 1, further comprising:
    a first cross-coupled inverter coupled between an input of the second amplifier stage and an output of the third amplifier stage; and
    a second cross-coupled inverter coupled between an input of the third amplifier stage and an output of the second amplifier stage.

12. The optical receiver circuit of claim 11, further comprising:
    a third cross-coupled inverter coupled between the input of the second amplifier stage and the input of the third amplifier stage; and
    a fourth cross-coupled inverter coupled between the input of the third amplifier stage and the input of the second amplifier stage.

13. An optical receiver circuit, comprising:
    a photodiode configured to generate an input current based on received optical signals;
    an output terminal configured to generate an output signal based on the input current; and
    a first amplifier stage coupled between an input terminal and the output terminal of the optical receiver circuit, the first amplifier stage comprising:
        a first inverter including an output coupled to the output terminal of the optical receiver circuit;
        a first inductor coupled to an input of the first inverter and configured to isolate or hide parasitic capacitances associated with the input terminal of the optical receiver circuit; and second inductor coupled to the input of the first inverter and configured to increase an effective feedback impedance of the optical receiver circuit at one or more operating frequencies;

a single-ended to differential conversion circuit coupled to an output of the first amplifier stage and configured to generate first and second delayed signals based at least in part on the input signal, wherein the first and second delayed signals form a differential signal indicative of the input signal;

a second amplifier stage coupled to the single-ended to differential conversion circuit and configured to generate a first component of a differential output signal based at least in part on the first delayed signal; and a third amplifier stage coupled to the single-ended to differential conversion circuit and configured to generate a second component of the differential output signal based at least in part on the second delayed signal.

14. The optical receiver circuit of claim 13, wherein the first and second inductors are coupled in series with each other, the first inductor comprises a first inductive coil formed in a first metal layer of a semiconductor device, the second inductor comprises a second inductive coil formed in a second metal layer of the semiconductor device, and the first and second inductive coils are aligned with each other.

15. The optical receiver circuit of claim 14, wherein first ends of the first and second inductive coils are coupled to the input of the first inverter by a via formed in the semiconductor device, and second ends of the first and second inductive coils are aligned with each other.

16. The optical receiver circuit of claim 13, wherein the second amplifier stage comprises:

a second inverter including an output coupled to the output terminal of the optical receiver circuit;

a third inductor coupled to an input of the second inverter and configured to isolate or hide parasitic capacitances associated with the input terminal of the optical receiver circuit; and a fourth inductor coupled to the input of the second inverter and configured to increase the effective feedback impedance of the optical receiver circuit at the one or more operating frequencies.

17. The optical receiver circuit of claim 16, wherein the third and fourth inductors are coupled in series with each other, the third inductor comprises a third inductive coil formed in a first metal layer of a semiconductor device, the fourth inductor comprises a fourth inductive coil formed in a second metal layer of the semiconductor device, and the third and fourth inductive coils are aligned with each other.

18. The optical receiver circuit of claim 17, wherein first ends of the third and fourth inductive coils are coupled to the input of the second inverter by a via formed in the semiconductor device, and second ends of the third and fourth inductive coils are aligned with each other.

19. A method for operating an optical receiver circuit including at least a photodiode, an output terminal, a first amplifier stage, a single-ended to differential conversion circuit, a second amplifier stage, and a third amplifier stage, the method comprising:

receiving one or more optical signals at the photodiode and generating an input signal based on the received optical signals;

hiding an input capacitance of the optical receiver circuit using a first inductor of the first amplifier stage, the first inductor coupled between the photodiode and an input of a first inverter of the first amplifier stage;

increasing an effective feedback impedance of the optical receiver circuit using a second inductor of the first amplifier stage, the second inductor coupled between the input of the first inverter and a first resistor, wherein the first resistor is coupled between the second inductor and an output of the first inverter; and generating an output signal at the output terminal, the output signal based at least in part on an output of the first inverter;

wherein generating the output signal comprises:

generating, using the single-ended to differential conversion circuit, first and second delayed signals based at least in part on the input signal, wherein the first and second delayed signals form a differential signal indicative of the input signal;

generating, using the second amplifier stage coupled to the single-ended to differential conversion circuit, a first component of a differential output signal based at least in part on the first delayed signal; and generating, using the third amplifier stage coupled to the single-ended to differential conversion circuit, a second component of the differential output signal based at least in part on the first delayed signal.

* * * * *